United States Patent
Wright et al.

(10) Patent No.: US 8,049,569 B1
(45) Date of Patent: Nov. 1, 2011

(54) CIRCUIT AND METHOD FOR IMPROVING THE ACCURACY OF A CRYSTAL-LESS OSCILLATOR HAVING DUAL-FREQUENCY MODES

(75) Inventors: David G. Wright, San Diego, CA (US); Timothy J. Williams, Bellevue, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 119 days.

(21) Appl. No.: 11/850,260

(22) Filed: Sep. 5, 2007

(51) Int. Cl.
*H03L 7/06* (2006.01)
(52) U.S. Cl. ............... 331/44; 331/25; 331/161
(58) Field of Classification Search ............ 331/25, 331/44, 161
See application file for complete search history.

(56) References Cited

U.S. PATENT DOCUMENTS

| | | | |
|---|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedorn |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |
| 4,656,603 A | 4/1987 | Dunn |

(Continued)

FOREIGN PATENT DOCUMENTS
DE 19710829 A1 9/1998
(Continued)

OTHER PUBLICATIONS

USPTO Notice of Allowance for U.S. Appl. No. 10/238,966 dated Jan. 27, 2009; 4 pages.

(Continued)

*Primary Examiner* — Robert Pascal
*Assistant Examiner* — James E Goodley

(57) ABSTRACT

A clock generation circuit is provided for improving the accuracy of a low power oscillator circuit contained therein. The clock generation circuit includes a crystal-less oscillator having at least two distinct frequency modes, including a low frequency mode and a high frequency mode. In some cases, the crystal-less oscillator may be adapted to generate a first clock frequency with relatively high accuracy and a second clock frequency with relatively low accuracy. A calibration and control circuit is included within the clock generation circuit for increasing the accuracy of the second clock frequency. In particular, the calibration and control circuit increases accuracy by using the first clock frequency to calibrate the second clock frequency generated by the same crystal-less oscillator. A system comprising the clock generation circuit and methods for operating a crystal-less oscillator having at least two distinct frequency modes are also provided herein.

20 Claims, 5 Drawing Sheets

U.S. PATENT DOCUMENTS

| | | |
|---|---|---|
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,408,235 A | 4/1995 | Doyle et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |

| | | | | | |
|---|---|---|---|---|---|
| 5,430,395 A | 7/1995 | Ichimaru | 5,630,052 A | 5/1997 | Shah |
| 5,430,687 A | 7/1995 | Hung et al. | 5,630,057 A | 5/1997 | Hait |
| 5,430,734 A | 7/1995 | Gilson | 5,630,102 A | 5/1997 | Johnson et al. |
| 5,432,476 A | 7/1995 | Tran | 5,631,577 A | 5/1997 | Freidin et al. |
| 5,438,672 A | 8/1995 | Dey | 5,633,766 A | 5/1997 | Hase et al. |
| 5,440,305 A | 8/1995 | Signore et al. | 5,642,295 A | 6/1997 | Smayling |
| 5,451,887 A | 9/1995 | El-Avat et al. | 5,646,544 A | 7/1997 | Iadanza |
| 5,453,904 A | 9/1995 | Higashiyama et al. | 5,646,901 A | 7/1997 | Sharpe-Geisler et al. |
| 5,455,525 A | 10/1995 | Ho et al. | 5,648,642 A | 7/1997 | Miller et al. |
| 5,455,731 A | 10/1995 | Parkinson | 5,651,035 A | 7/1997 | Tozun et al. |
| 5,455,927 A | 10/1995 | Huang | 5,652,893 A | 7/1997 | Ben-Meir et al. |
| 5,457,410 A | 10/1995 | Ting | 5,661,433 A | 8/1997 | LaRosa et al. |
| 5,457,479 A | 10/1995 | Cheng | 5,663,900 A | 9/1997 | Bhandari et al. |
| 5,463,591 A | 10/1995 | Aimoto et al. | 5,663,965 A | 9/1997 | Seymour |
| 5,479,603 A | 12/1995 | Stone et al. | 5,664,199 A | 9/1997 | Kuwahara |
| 5,479,643 A | 12/1995 | Bhaskar et al. | 5,666,480 A | 9/1997 | Leung et al. |
| 5,479,652 A | 12/1995 | Dreyer et al. | 5,670,915 A | 9/1997 | Cooper et al. |
| 5,481,471 A | 1/1996 | Naglestad et al. | 5,673,198 A | 9/1997 | Lawman et al. |
| 5,488,204 A | 1/1996 | Mead et al. | 5,675,825 A | 10/1997 | Dreyer et al. |
| 5,491,458 A | 2/1996 | McCune, Jr. et al. | 5,677,691 A | 10/1997 | Hosticka et al. |
| 5,493,246 A | 2/1996 | Anderson | 5,680,070 A | 10/1997 | Anderson et al. |
| 5,493,723 A | 2/1996 | Beck et al. | 5,682,032 A | 10/1997 | Philipp |
| 5,495,077 A | 2/1996 | Miller et al. | 5,684,434 A | 11/1997 | Mann et al. |
| 5,495,593 A | 2/1996 | Elmer et al. | 5,684,952 A | 11/1997 | Stein |
| 5,495,594 A | 2/1996 | MacKenna et al. | 5,686,844 A | 11/1997 | Hull et al. |
| 5,497,119 A | 3/1996 | Tedrow et al. | 5,687,325 A | 11/1997 | Chang |
| 5,499,192 A | 3/1996 | Knapp et al. | 5,689,195 A | 11/1997 | Cliff et al. |
| 5,500,823 A | 3/1996 | Martin et al. | 5,689,196 A | 11/1997 | Schutte |
| 5,517,198 A | 5/1996 | McEwan | 5,691,664 A | 11/1997 | Anderson et al. |
| 5,519,854 A | 5/1996 | Watt | 5,691,898 A | 11/1997 | Rosenberg et al. |
| 5,521,529 A | 5/1996 | Agrawal et al. | 5,694,063 A | 12/1997 | Burlison et al. |
| 5,530,444 A | 6/1996 | Tice et al. | 5,696,952 A | 12/1997 | Pontarelli |
| 5,530,673 A | 6/1996 | Tobita et al. | 5,699,024 A | 12/1997 | Manlove et al. |
| 5,530,813 A | 6/1996 | Paulsen et al. | 5,703,871 A | 12/1997 | Pope et al. |
| 5,537,057 A | 7/1996 | Leong et al. | 5,706,453 A | 1/1998 | Cheng et al. |
| 5,541,878 A | 7/1996 | LeMoncheck et al. | 5,708,589 A | 1/1998 | Beauvais |
| 5,542,055 A | 7/1996 | Amini et al. | 5,708,798 A | 1/1998 | Lynch et al. |
| 5,543,588 A | 8/1996 | Bisset et al. | 5,710,906 A | 1/1998 | Ghosh et al. |
| 5,543,590 A | 8/1996 | Gillespie et al. | 5,712,969 A | 1/1998 | Zimmermann et al. |
| 5,543,591 A | 8/1996 | Gillespie et al. | 5,721,931 A | 2/1998 | Gephardt et al. |
| 5,544,067 A | 8/1996 | Rostoker et al. | 5,724,009 A | 3/1998 | Collins et al. |
| 5,544,311 A | 8/1996 | Harenberg et al. | 5,727,170 A | 3/1998 | Mitchell et al. |
| 5,546,433 A | 8/1996 | Tran et al. | 5,728,933 A | 3/1998 | Schultz et |
| 5,546,562 A | 8/1996 | Patel | 5,729,704 A | 3/1998 | Stone et al. |
| 5,552,725 A | 9/1996 | Ray et al. | 5,730,165 A | 3/1998 | Philipp |
| 5,552,748 A | 9/1996 | O'Shaughnessy | 5,732,277 A | 3/1998 | Kodosky et al. |
| 5,554,951 A | 9/1996 | Gough | 5,734,272 A | 3/1998 | Belot et al. |
| 5,555,452 A | 9/1996 | Callaway et al. | 5,734,334 A | 3/1998 | Hsieh et al. |
| 5,555,907 A | 9/1996 | Philipp | 5,737,557 A | 4/1998 | Sullivan |
| 5,557,762 A | 9/1996 | Okuaki et al. | 5,737,760 A | 4/1998 | Grimmer et al. |
| 5,559,502 A | 9/1996 | Schutte | 5,745,011 A | 4/1998 | Scott |
| 5,559,996 A | 9/1996 | Fujioka et al. | 5,748,048 A | 5/1998 | Moyal |
| 5,563,526 A | 10/1996 | Hastings et al. | 5,748,875 A | 5/1998 | Tzori |
| 5,563,529 A | 10/1996 | Seltzer et al. | 5,752,013 A | 5/1998 | Christensen et al. |
| 5,564,010 A | 10/1996 | Henry et al. | 5,754,552 A | 5/1998 | Allmond et al. |
| 5,564,108 A | 10/1996 | Hunsaker et al. | 5,754,826 A | 5/1998 | Gamal et al. |
| 5,565,658 A | 10/1996 | Gerpheide et al. | 5,757,368 A | 5/1998 | Gerpheide et al. |
| 5,566,702 A | 10/1996 | Philipp | 5,758,058 A | 5/1998 | Milburn |
| 5,572,665 A | 11/1996 | Nakabayashi et al. | 5,761,128 A | 6/1998 | Watanabe |
| 5,572,719 A | 11/1996 | Biesterfeldt | 5,763,909 A | 6/1998 | Mead et al. |
| 5,574,678 A | 11/1996 | Gorecki | 5,764,714 A | 6/1998 | Stansell et al. |
| 5,574,852 A | 11/1996 | Bakker et al. | 5,767,457 A | 6/1998 | Gerpheide et al. |
| 5,574,892 A | 11/1996 | Christensen | 5,774,704 A | 6/1998 | Williams |
| 5,579,353 A | 11/1996 | Parmenter et al. | 5,777,399 A | 7/1998 | Shibuya |
| 5,587,945 A | 12/1996 | Lin et al. | 5,781,030 A | 7/1998 | Agrawal et al. |
| 5,587,957 A | 12/1996 | Kowalczyk et al. | 5,781,747 A | 7/1998 | Smith et al. |
| 5,590,354 A | 12/1996 | Klapproth et al. | 5,784,545 A | 7/1998 | Anderson et al. |
| 5,594,388 A | 1/1997 | O'Shaughnessy et al. | 5,790,957 A | 8/1998 | Heidari |
| 5,594,734 A | 1/1997 | Worsley et al. | 5,796,183 A | 8/1998 | Hourmand |
| 5,594,876 A | 1/1997 | Getzlaff et al. | 5,799,176 A | 8/1998 | Kapusta et al. |
| 5,594,890 A | 1/1997 | Yamaura et al. | 5,801,958 A | 9/1998 | Dangelo et al. |
| 5,600,262 A | 2/1997 | Kolze | 5,802,073 A | 9/1998 | Platt |
| 5,604,466 A | 2/1997 | Dreps et al. | 5,802,290 A | 9/1998 | Casselman |
| 5,608,892 A | 3/1997 | Wakerly | 5,805,792 A | 9/1998 | Swoboda et al. |
| 5,614,861 A | 3/1997 | Harada | 5,805,897 A | 9/1998 | Glowny |
| 5,625,316 A | 4/1997 | Chambers et al. | 5,808,883 A | 9/1998 | Hawkes |
| 5,625,583 A | 4/1997 | Hyatt | 5,811,987 A | 9/1998 | Ashmore, Jr. et al. |
| 5,629,857 A | 5/1997 | Brennan | 5,812,698 A | 9/1998 | Platt et al. |
| 5,629,891 A | 5/1997 | LeMoncheck et al. | 5,818,254 A | 10/1998 | Agrawal et al. |

| | | | | | | |
|---|---|---|---|---|---|---|
| 5,818,444 | A | 10/1998 | Alimpich et al. | 5,963,075 | A | 10/1999 | Hiiragizawa |
| 5,818,736 | A | 10/1998 | Leibold | 5,963,105 | A | 10/1999 | Nguyen |
| 5,819,028 | A | 10/1998 | Manghirmalani et al. | 5,963,503 | A | 10/1999 | Lee |
| 5,822,387 | A | 10/1998 | Mar | 5,964,893 | A | 10/1999 | Circello et al. |
| 5,822,531 | A | 10/1998 | Gorczyca et al. | 5,966,027 | A | 10/1999 | Kapusta et al. |
| 5,828,693 | A | 10/1998 | Mays et al. | 5,966,532 | A | 10/1999 | McDonald et al. |
| 5,838,583 | A | 11/1998 | Varadarajan et al. | 5,968,135 | A | 10/1999 | Teramoto et al. |
| 5,841,078 | A | 11/1998 | Miller et al. | 5,969,513 | A | 10/1999 | Clark |
| 5,841,996 | A | 11/1998 | Nolan et al. | 5,969,632 | A | 10/1999 | Diamant et al. |
| 5,844,256 | A | 12/1998 | Mead et al. | 5,973,368 | A | 10/1999 | Pearce et al. |
| 5,844,404 | A | 12/1998 | Caser et al. | 5,974,235 | A | 10/1999 | Nunally et al. |
| 5,848,285 | A | 12/1998 | Kapusta et al. | 5,977,791 | A | 11/1999 | Veenstra |
| 5,850,156 | A | 12/1998 | Wittman | 5,978,584 | A | 11/1999 | Nishibata et al. |
| 5,852,733 | A | 12/1998 | Chien et al. | 5,978,937 | A | 11/1999 | Miyamori et al. |
| 5,854,625 | A | 12/1998 | Frisch et al. | 5,982,105 | A | 11/1999 | Masters |
| 5,857,109 | A | 1/1999 | Taylor | 5,982,229 | A | 11/1999 | Wong et al. |
| 5,861,583 | A | 1/1999 | Schediwy et al. | 5,982,241 | A | 11/1999 | Nguyen et al. |
| 5,861,875 | A | 1/1999 | Gerpheide | 5,983,277 | A | 11/1999 | Heile et al. |
| 5,864,242 | A | 1/1999 | Allen et al. | 5,986,479 | A | 11/1999 | Mohan |
| 5,864,392 | A | 1/1999 | Winklhofer et al. | 5,987,246 | A | 11/1999 | Thomsen et al. |
| 5,867,046 | A | 2/1999 | Sugasawa | 5,988,902 | A | 11/1999 | Holehan |
| 5,867,399 | A | 2/1999 | Rostoker et al. | 5,994,939 | A | 11/1999 | Johnson et al. |
| 5,869,979 | A | 2/1999 | Bocchino | 5,996,032 | A | 11/1999 | Baker |
| 5,870,004 | A | 2/1999 | Lu | 5,999,725 | A | 12/1999 | Barbier et al. |
| 5,870,309 | A | 2/1999 | Lawman | 6,002,268 | A | 12/1999 | Sasaki et al. |
| 5,870,345 | A | 2/1999 | Stecker | 6,002,398 | A | 12/1999 | Wilson |
| 5,872,464 | A | 2/1999 | Gradinariu | 6,003,054 | A | 12/1999 | Oshima et al. |
| 5,874,958 | A | 2/1999 | Ludolph | 6,003,107 | A | 12/1999 | Ranson et al. |
| 5,875,293 | A | 2/1999 | Bell et al. | 6,003,133 | A | 12/1999 | Moughanni et al. |
| 5,877,656 | A | 3/1999 | Mann et al. | 6,005,814 | A | 12/1999 | Mulholland et al. |
| 5,878,425 | A | 3/1999 | Redpath | 6,005,904 | A | 12/1999 | Knapp et al. |
| 5,880,411 | A | 3/1999 | Gillespie et al. | 6,008,685 | A | 12/1999 | Kunst |
| 5,880,598 | A | 3/1999 | Duong | 6,008,703 | A | 12/1999 | Perrott et al. |
| 5,883,623 | A | 3/1999 | Cseri | 6,009,270 | A | 12/1999 | Mann |
| 5,886,582 | A | 3/1999 | Stansell | 6,009,496 | A | 12/1999 | Tsai |
| 5,887,189 | A | 3/1999 | Birns et al. | 6,011,407 | A | 1/2000 | New |
| 5,889,236 | A | 3/1999 | Gillespie et al. | 6,012,835 | A | 1/2000 | Thompson et al. |
| 5,889,723 | A | 3/1999 | Pascucci | 6,014,135 | A | 1/2000 | Fernandes |
| 5,889,936 | A | 3/1999 | Chan | 6,014,509 | A | 1/2000 | Furtek et al. |
| 5,889,988 | A | 3/1999 | Held | 6,014,723 | A | 1/2000 | Tremblay et al. |
| 5,894,226 | A | 4/1999 | Koyama | 6,016,554 | A | 1/2000 | Skrovan et al. |
| 5,894,243 | A | 4/1999 | Hwang | 6,016,563 | A | 1/2000 | Fleisher |
| 5,894,565 | A | 4/1999 | Furtek et al. | 6,018,559 | A | 1/2000 | Azegami et al. |
| 5,895,494 | A | 4/1999 | Scalzi et al. | 6,023,422 | A | 2/2000 | Allen et al. |
| 5,896,068 | A | 4/1999 | Moyal | 6,023,565 | A | 2/2000 | Lawman et al. |
| 5,896,330 | A | 4/1999 | Gibson | 6,026,134 | A | 2/2000 | Duffy et al. |
| 5,898,345 | A | 4/1999 | Namura et al. | 6,026,501 | A | 2/2000 | Hohl et al. |
| 5,900,780 | A | 5/1999 | Hirose et al. | 6,028,271 | A | 2/2000 | Gillespie et al. |
| 5,901,062 | A | 5/1999 | Burch et al. | 6,028,959 | A | 2/2000 | Wang et al. |
| 5,903,718 | A | 5/1999 | Marik | 6,031,365 | A | 2/2000 | Sharpe-Geisler |
| 5,905,398 | A | 5/1999 | Todsen et al. | 6,032,268 | A | 2/2000 | Swoboda et al. |
| 5,909,544 | A | 6/1999 | Anderson, II et al. | 6,034,538 | A | 3/2000 | Abramovici |
| 5,911,059 | A | 6/1999 | Profit, Jr. | 6,035,320 | A | 3/2000 | Kiriaki et al. |
| 5,914,465 | A | 6/1999 | Allen et al. | 6,037,807 | A | 3/2000 | Wu et al. |
| 5,914,633 | A | 6/1999 | Comino et al. | 6,038,551 | A | 3/2000 | Barlow et al. |
| 5,914,708 | A | 6/1999 | LaGrange et al. | 6,041,406 | A | 3/2000 | Mann |
| 5,917,356 | A | 6/1999 | Casal et al. | 6,043,695 | A | 3/2000 | O'Sullivan |
| 5,920,310 | A | 7/1999 | Faggin et al. | 6,043,719 | A | 3/2000 | Lin et al. |
| 5,923,264 | A | 7/1999 | Lavelle et al. | 6,049,223 | A | 4/2000 | Lytle et al. |
| 5,926,566 | A | 7/1999 | Wang et al. | 6,049,225 | A | 4/2000 | Huang et al. |
| 5,929,710 | A | 7/1999 | Bien | 6,051,772 | A | 4/2000 | Cameron et al. |
| 5,930,148 | A | 7/1999 | Bjorksten et al. | 6,052,035 | A | 4/2000 | Nolan et al. |
| 5,930,150 | A | 7/1999 | Cohen et al. | 6,052,524 | A | 4/2000 | Pauna |
| 5,931,959 | A | 8/1999 | Kwiat | 6,055,584 | A | 4/2000 | Bridges et al. |
| 5,933,023 | A | 8/1999 | Young | 6,057,705 | A | 5/2000 | Wojewoda et al. |
| 5,933,356 | A | 8/1999 | Rostoker et al. | 6,058,263 | A | 5/2000 | Voth |
| 5,933,816 | A | 8/1999 | Zeanah et al. | 6,058,452 | A | 5/2000 | Rangasayee et al. |
| 5,935,233 | A | 8/1999 | Jeddeloh | 6,061,511 | A | 5/2000 | Marantz et al. |
| 5,935,266 | A | 8/1999 | Thurnhofer et al. | 6,066,961 | A | 5/2000 | Lee et al. |
| 5,939,904 | A | 8/1999 | Fetterman et al. | 6,070,003 | A | 5/2000 | Gove et al. |
| 5,939,949 | A | 8/1999 | Olgaard et al. | 6,072,803 | A | 6/2000 | Alimond et al. |
| 5,941,991 | A | 8/1999 | Kageshima | 6,075,941 | A | 6/2000 | Itoh et al. |
| 5,942,733 | A | 8/1999 | Allen et al. | 6,079,985 | A | 6/2000 | Wohl et al. |
| 5,943,052 | A | 8/1999 | Allen et al. | 6,081,140 | A | 6/2000 | King |
| 5,945,878 | A | 8/1999 | Westwick et al. | 6,094,730 | A | 7/2000 | Lopez et al. |
| 5,949,632 | A | 9/1999 | Barreras, Sr. et al. | 6,097,211 | A | 8/2000 | Couts-Martin et al. |
| 5,952,888 | A | 9/1999 | Scott | 6,097,432 | A | 8/2000 | Mead et al. |
| 5,956,279 | A | 9/1999 | Mo et al. | 6,101,457 | A | 8/2000 | Barch et al. |
| 5,959,871 | A | 9/1999 | Pierzchala et al. | 6,101,617 | A | 8/2000 | Burckhartt et al. |

| | | | | | | |
|---|---|---|---|---|---|---|
| 6,104,217 | A | 8/2000 | Magana | 6,236,278 | B1 | 5/2001 | Olgaard |
| 6,104,325 | A | 8/2000 | Liaw et al. | 6,236,593 | B1 | 5/2001 | Hong et al. |
| 6,107,769 | A | 8/2000 | Saylor et al. | 6,239,389 | B1 | 5/2001 | Allen et al. |
| 6,107,826 | A | 8/2000 | Young et al. | 6,239,798 | B1 | 5/2001 | Ludolph et al. |
| 6,107,882 | A | 8/2000 | Gabara et al. | 6,240,375 | B1 | 5/2001 | Sonoda |
| 6,110,223 | A | 8/2000 | Southgate et al. | 6,246,258 | B1 | 6/2001 | Lesea |
| 6,111,431 | A | 8/2000 | Estrada | 6,246,410 | B1 | 6/2001 | Bergeron et al. |
| 6,112,264 | A | 8/2000 | Beasley et al. | 6,249,167 | B1 | 6/2001 | Oguchi et al. |
| 6,121,791 | A | 9/2000 | Abbott | 6,249,447 | B1 | 6/2001 | Boylan et al. |
| 6,121,805 | A | 9/2000 | Thamsirianunt et al. | 6,253,250 | B1 | 6/2001 | Evans et al. |
| 6,121,965 | A | 9/2000 | Kenney et al. | 6,253,754 | B1 | 7/2001 | Ward |
| 6,125,416 | A | 9/2000 | Warren | 6,262,717 | B1 | 7/2001 | Donohue et al. |
| 6,130,548 | A | 10/2000 | Koifman | 6,263,302 | B1 | 7/2001 | Hellestrand et al. |
| 6,130,551 | A | 10/2000 | Agrawal et al. | 6,263,339 | B1 | 7/2001 | Hirsch |
| 6,130,552 | A | 10/2000 | Jefferson et al. | 6,263,484 | B1 | 7/2001 | Yang |
| 6,133,773 | A | 10/2000 | Garlepp et al. | 7,171,455 | B1 | 7/2001 | Gupta et al. |
| 6,134,181 | A | 10/2000 | Landry | 6,271,679 | B1 | 8/2001 | McClintock et al. |
| 6,134,516 | A | 10/2000 | Wang et al. | 6,272,646 | B1 | 8/2001 | Rangasayee |
| 6,137,308 | A | 10/2000 | Nayak | 6,275,117 | B1 | 8/2001 | Abugharbieh et al. |
| 6,140,853 | A | 10/2000 | Lo | 6,278,568 | B1 | 8/2001 | Cloke et al. |
| 6,141,376 | A | 10/2000 | Shaw | 6,280,391 | B1 | 8/2001 | Olson et al. |
| 6,141,764 | A | 10/2000 | Ezell | 6,281,753 | B1 | 8/2001 | Corsi et al. |
| 6,144,327 | A | 11/2000 | Distinti et al. | 6,282,547 | B1 | 8/2001 | Hirsch |
| 6,148,104 | A | 11/2000 | Wang et al. | 6,282,551 | B1 | 8/2001 | Anderson et al. |
| 6,148,441 | A | 11/2000 | Woodward | 6,286,127 | B1 | 9/2001 | King et al. |
| 6,149,299 | A | 11/2000 | Aslan et al. | 6,288,707 | B1 | 9/2001 | Philipp |
| 6,150,866 | A | 11/2000 | Eto et al. | 6,289,300 | B1 | 9/2001 | Brannick et al. |
| 6,154,064 | A | 11/2000 | Proebsting | 6,289,478 | B1 | 9/2001 | Kitagaki |
| 6,157,024 | A | 12/2000 | Chapdelaine et al. | 6,289,489 | B1 | 9/2001 | Bold et al. |
| 6,157,270 | A | 12/2000 | Tso | 6,292,028 | B1 | 9/2001 | Tomita |
| 6,161,199 | A | 12/2000 | Szeto et al. | 6,294,932 | B1 | 9/2001 | Watarai |
| 6,166,367 | A | 12/2000 | Cho | 6,294,962 | B1 | 9/2001 | Mar |
| 6,166,960 | A | 12/2000 | Marneweck et al. | 6,298,320 | B1 | 10/2001 | Buckmaster et al. |
| 6,167,077 | A | 12/2000 | Ducaroir | 6,304,014 | B1 | 10/2001 | England et al. |
| 6,167,364 | A | 12/2000 | Stellenberg et al. | 6,304,101 | B1 | 10/2001 | Nishihara |
| 6,167,559 | A | 12/2000 | Furtek et al. | 6,304,790 | B1 | 10/2001 | Nakamura et al. |
| 6,169,383 | B1 | 1/2001 | Sabin et al. | 6,307,413 | B1 | 10/2001 | Dalmia et al. |
| 6,172,428 | B1 | 1/2001 | Jordan | 6,310,521 | B1 | 10/2001 | Dalmia |
| 6,172,571 | B1 | 1/2001 | Moyal et al. | 6,310,611 | B1 | 10/2001 | Caldwell |
| 6,173,419 | B1 | 1/2001 | Barnett | 6,311,149 | B1 | 10/2001 | Ryan et al. |
| 6,175,914 | B1 | 1/2001 | Mann | 7,406,674 | B1 | 10/2001 | Ogami et al. |
| 6,175,949 | B1 | 1/2001 | Gristede et al. | 6,314,530 | B1 | 11/2001 | Mann |
| 6,181,163 | B1 | 1/2001 | Agrawal et al. | 6,320,184 | B1 | 11/2001 | Winklhofer et al. |
| 6,183,131 | B1 | 2/2001 | Holloway et al. | 6,320,282 | B1 | 11/2001 | Caldwell |
| 6,185,127 | B1 | 2/2001 | Myers et al. | 6,321,369 | B1 | 11/2001 | Heile et al. |
| 6,185,450 | B1 | 2/2001 | Seguine et al. | 6,323,846 | B1 | 11/2001 | Westerman et al. |
| 6,185,522 | B1 | 2/2001 | Bakker | 6,324,628 | B1 | 11/2001 | Chan |
| 6,185,703 | B1 | 2/2001 | Guddat et al. | 6,326,859 | B1 | 12/2001 | Goldman et al. |
| 6,185,732 | B1 | 2/2001 | Mann et al. | 6,332,137 | B1 | 12/2001 | Hori et al. |
| 6,188,228 | B1 | 2/2001 | Philipp | 6,332,201 | B1 | 12/2001 | Chin et al. |
| 6,188,241 | B1 | 2/2001 | Gauthier et al. | 6,337,579 | B1 | 1/2002 | Mochida |
| 6,188,381 | B1 | 2/2001 | van der Wal et al. | 6,338,109 | B1 | 1/2002 | Snyder et al. |
| 6,188,391 | B1 | 2/2001 | Seely et al. | 6,339,815 | B1 | 1/2002 | Feng et al. |
| 6,188,975 | B1 | 2/2001 | Gay | 6,342,907 | B1 | 1/2002 | Petty et al. |
| 6,191,603 | B1 | 2/2001 | Muradali et al. | 6,345,383 | B1 | 2/2002 | Ueki |
| 6,191,660 | B1 | 2/2001 | Mar et al. | 6,347,395 | B1 | 2/2002 | Payne et al. |
| 6,191,998 | B1 | 2/2001 | Reddy et al. | 6,351,789 | B1 | 2/2002 | Green |
| 6,192,431 | B1 | 2/2001 | Dabral et al. | 6,353,452 | B1 | 3/2002 | Hamada et al. |
| 6,198,303 | B1 | 3/2001 | Rangasayee | 6,355,980 | B1 | 3/2002 | Callahan |
| 6,201,407 | B1 | 3/2001 | Kapusta et al. | 6,356,862 | B2 | 3/2002 | Bailey |
| 6,201,829 | B1 | 3/2001 | Schneider | 6,356,958 | B1 | 3/2002 | Lin |
| 6,202,044 | B1 | 3/2001 | Tzori | 6,356,960 | B1 | 3/2002 | Jones et al. |
| 6,204,687 | B1 | 3/2001 | Schultz et al. | 6,359,950 | B2 | 3/2002 | Gossmann et al. |
| 6,205,574 | B1 | 3/2001 | Dellinger et al. | 6,362,697 | B1 | 3/2002 | Pulvirenti |
| 6,208,572 | B1 | 3/2001 | Adams et al. | 6,366,174 | B1 | 4/2002 | Berry et al. |
| 6,211,708 | B1 | 4/2001 | Klemmer | 6,366,300 | B1 | 4/2002 | Ohara et al. |
| 6,211,715 | B1 | 4/2001 | Terauchi | 6,366,874 | B1 | 4/2002 | Lee et al. |
| 6,211,741 | B1 | 4/2001 | Dalmia | 6,366,878 | B1 | 4/2002 | Grunert |
| 6,215,352 | B1 | 4/2001 | Sudo | 6,369,660 | B1 | 4/2002 | Wei |
| 6,216,254 | B1 | 4/2001 | Pesce et al. | 6,373,954 | B1 | 4/2002 | Malcolm et al. |
| 6,219,729 | B1 | 4/2001 | Keats et al. | 6,374,370 | B1 | 4/2002 | Bockhaus et al. |
| 6,222,528 | B1 | 4/2001 | Gerpheide et al. | 6,377,009 | B1 | 4/2002 | Philipp |
| 6,223,144 | B1 | 4/2001 | Barnett et al. | 6,377,575 | B1 | 4/2002 | Mullaney et al. |
| 6,223,147 | B1 | 4/2001 | Bowers | 6,377,646 | B1 | 4/2002 | Sha |
| 6,223,272 | B1 | 4/2001 | Coehlo et al. | 6,380,811 | B1 | 4/2002 | Zarubinsky et al. |
| RE37,195 | E | 5/2001 | Kean | 6,380,929 | B1 | 4/2002 | Platt |
| 6,225,866 | B1 | 5/2001 | Kubota et al. | 6,380,931 | B1 | 4/2002 | Gillespie et al. |
| 6,236,242 | B1 | 5/2001 | Hedberg | 6,384,947 | B1 | 5/2002 | Ackerman et al. |
| 6,236,275 | B1 | 5/2001 | Dent | 6,385,742 | B1 | 5/2002 | Kirsch et al. |

| | | |
|---|---|---|
| 6,388,109 B1 | 5/2002 | Schwarz et al. |
| 6,388,464 B1 | 5/2002 | Lacey et al. |
| 6,396,302 B2 | 5/2002 | New et al. |
| 6,396,657 B1 | 5/2002 | Sun et al. |
| 6,397,232 B1 | 5/2002 | Cheng-Hung et al. |
| 6,401,230 B1 | 6/2002 | Ahanessians et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,421,817 B1 | 7/2002 | Mohan et al. |
| 6,425,109 B1 | 7/2002 | Choukalos et al. |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard et al. |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Insenser Farre et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Rab et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,969 B2 | 12/2002 | Feng et al. |
| 6,496,971 B1 | 12/2002 | Lesea et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | McDonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,546,297 B1 | 4/2003 | Gaston et al. |
| 6,552,933 B2 | 4/2003 | Roohparvar |
| 6,553,057 B1 | 4/2003 | Sha |
| 6,554,469 B1 | 4/2003 | Thomson et al. |
| 6,556,044 B2 | 4/2003 | Langhammer et al. |
| 6,557,164 B1 | 4/2003 | Faustini |
| 6,559,685 B2 | 5/2003 | Green |
| 6,560,306 B1 | 5/2003 | Duffy et al. |
| 6,560,699 B1 | 5/2003 | Konkle |
| 6,563,391 B1 | 5/2003 | Mar |
| 6,564,179 B1 | 5/2003 | Belhaj |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,590,589 B1 | 7/2003 | Sluiman et al. |
| 6,591,369 B1 | 7/2003 | Edwards et al. |
| 6,592,626 B1 | 7/2003 | Bauchot et al. |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,634,009 B1 | 10/2003 | Molson et al. |
| 6,636,096 B2 | 10/2003 | Schaffer et al. |
| 6,636,169 B1 | 10/2003 | Distinti et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B1 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |
| 6,661,410 B2 | 12/2003 | Casebolt et al. |
| 6,661,724 B1 | 12/2003 | Snyder et al. |

| | | | | | |
|---|---|---|---|---|---|
| 6,664,978 B1 | 12/2003 | Kekic et al. | 6,798,299 B1 | 9/2004 | Mar et al. |
| 6,664,991 B1 | 12/2003 | Chew et al. | 6,799,198 B1 | 9/2004 | Huboi et al. |
| 6,667,642 B1 | 12/2003 | Moyal | 6,806,771 B1 | 10/2004 | Hildebrant et al. |
| 6,667,740 B2 | 12/2003 | Ely et al. | 6,806,782 B2 | 10/2004 | Motoyoshi et al. |
| 6,670,852 B1 | 12/2003 | Hauck | 6,809,275 B1 | 10/2004 | Cheng et al. |
| 6,671,869 B2 | 12/2003 | Davidson et al. | 6,809,566 B1 | 10/2004 | Xin-LeBlanc |
| 6,673,308 B2 | 1/2004 | Hino et al. | 6,810,442 B1 | 10/2004 | Lin et al. |
| 6,677,814 B2 | 1/2004 | Low et al. | 6,815,979 B2 | 11/2004 | Ooshita |
| 6,677,932 B1 | 1/2004 | Westerman | 6,816,544 B1 | 11/2004 | Bailey et al. |
| 6,678,645 B1 | 1/2004 | Rajsuman et al. | 6,817,005 B2 | 11/2004 | Mason et al. |
| 6,678,877 B1 | 1/2004 | Perry et al. | 6,819,142 B1 | 11/2004 | Viehmann et al. |
| 6,680,632 B1 | 1/2004 | Meyers et al. | 6,823,282 B1 | 11/2004 | Snyder |
| 6,680,731 B2 | 1/2004 | Gerpheide et al. | 6,823,497 B2 | 11/2004 | Schubert et al. |
| 6,681,280 B1 | 1/2004 | Miyake et al. | 6,825,689 B1 | 11/2004 | Snyder |
| 6,681,359 B1 | 1/2004 | Au et al. | 6,825,869 B2 | 11/2004 | Bang |
| 6,683,462 B2 | 1/2004 | Shimizu | 6,828,824 B2 | 12/2004 | Betz et al. |
| 6,683,930 B1 | 1/2004 | Dalmia | 6,829,727 B1 | 12/2004 | Pawloski |
| 6,686,787 B2 | 2/2004 | Ling | 6,834,384 B2 | 12/2004 | Fiorella, III et al. |
| 6,686,860 B2 | 2/2004 | Gulati et al. | 6,836,169 B2 | 12/2004 | Richmond et al. |
| 6,690,224 B1 | 2/2004 | Moore | 6,839,774 B1 | 1/2005 | Ahn et al. |
| 6,691,193 B1 | 2/2004 | Wang et al. | 6,842,710 B1 | 1/2005 | Gehring et al. |
| 6,691,301 B2 | 2/2004 | Bowen | 6,847,203 B1 | 1/2005 | Conti et al. |
| 6,697,754 B1 | 2/2004 | Alexander | 6,850,117 B2 | 2/2005 | Weber et al. |
| 6,701,340 B1 | 3/2004 | Gorecki et al. | 6,850,554 B1 | 2/2005 | Sha |
| 6,701,487 B1 | 3/2004 | Ogami et al. | 6,853,598 B2 | 2/2005 | Chevallier |
| 6,701,508 B1 | 3/2004 | Bartz et al. | 6,854,067 B1 | 2/2005 | Kutz et al. |
| 6,703,961 B2 | 3/2004 | Mueck et al. | 6,856,433 B2 | 2/2005 | Hatano et al. |
| 6,704,381 B1 | 3/2004 | Moyal et al. | 6,859,884 B1 | 2/2005 | Sullam |
| 6,704,879 B1 | 3/2004 | Parrish | 6,862,240 B2 | 3/2005 | Burgan |
| 6,704,889 B2 | 3/2004 | Veenstra et al. | 6,864,710 B1 | 3/2005 | Lacey et al. |
| 6,704,893 B1 | 3/2004 | Bauwens et al. | 6,865,429 B1 | 3/2005 | Schneider et al. |
| 6,705,511 B1 | 3/2004 | Dames et al. | 6,865,504 B2 | 3/2005 | Larson et al. |
| 6,711,226 B1 | 3/2004 | Williams et al. | 6,868,500 B1 | 3/2005 | Kutz et al. |
| 6,711,731 B2 | 3/2004 | Weiss | 6,871,253 B2 | 3/2005 | Greeff et al. |
| 6,713,897 B2 | 3/2004 | Caldwell | 6,871,331 B1 | 3/2005 | Bloom et al. |
| 6,714,066 B2 | 3/2004 | Gorecki et al. | 6,873,203 B1 | 3/2005 | Latham, II et al. |
| 6,714,817 B2 | 3/2004 | Daynes et al. | 6,873,210 B2 | 3/2005 | Mulder et al. |
| 6,715,132 B1 | 3/2004 | Bartz et al. | 6,876,941 B2 | 4/2005 | Nightingale |
| 6,371,878 B1 | 4/2004 | Bowen | 6,880,086 B2 | 4/2005 | Kidder et al. |
| 6,717,474 B2 | 4/2004 | Chen et al. | 6,888,453 B2 | 5/2005 | Lutz et al. |
| 6,718,294 B1 | 4/2004 | Bortfeld | 6,888,538 B2 | 5/2005 | Ely et al. |
| 6,718,520 B1 | 4/2004 | Marryman et al. | 6,892,310 B1 | 5/2005 | Kutz et al. |
| 6,718,533 B1 | 4/2004 | Schneider et al. | 6,892,322 B1 | 5/2005 | Snyder |
| 6,724,220 B1 | 4/2004 | Snyder et al. | 6,893,724 B2 | 5/2005 | Lin et al. |
| 6,725,441 B1 | 4/2004 | Keller et al. | 6,894,928 B2 | 5/2005 | Owen |
| 6,728,900 B1 | 4/2004 | Meli | 6,897,390 B2 | 5/2005 | Caldwell et al. |
| 6,728,902 B2 | 4/2004 | Kaiser et al. | 6,898,703 B1 | 5/2005 | Ogami et al. |
| 6,730,863 B1 | 5/2004 | Gerpheide | 6,900,663 B1 | 5/2005 | Roper et al. |
| 6,731,552 B2 | 5/2004 | Perner | 6,901,014 B2 | 5/2005 | Son et al. |
| 6,732,068 B2 | 5/2004 | Sample et al. | 6,901,563 B1 | 5/2005 | Ogami et al. |
| 6,732,347 B1 | 5/2004 | Camilleri et al. | 6,903,402 B2 | 6/2005 | Miyazawa |
| 6,738,858 B1 | 5/2004 | Fernald et al. | 6,903,613 B1 | 6/2005 | Mitchell et al. |
| 6,744,323 B1 | 6/2004 | Moyal et al. | 6,904,570 B2 | 6/2005 | Foote et al. |
| 6,745,369 B1 | 6/2004 | May et al. | 6,910,126 B1 | 6/2005 | Mar et al. |
| 6,748,569 B1 | 6/2004 | Brooke et al. | 6,911,857 B1 | 6/2005 | Stiff |
| 6,750,852 B2 | 6/2004 | Gillespie | 6,917,661 B1 | 7/2005 | Scott et al. |
| 6,750,876 B1 | 6/2004 | Atsatt et al. | 6,922,821 B1 | 7/2005 | Nemecek |
| 6,750,889 B1 | 6/2004 | Livingston et al. | 6,924,668 B2 | 8/2005 | Muller et al. |
| 6,754,101 B2 | 6/2004 | Terzioglu et al. | 6,934,674 B1 | 8/2005 | Douezy et al. |
| 6,754,723 B2 | 6/2004 | Kato | 6,937,075 B2 | 8/2005 | Lim et al. |
| 6,754,765 B1 | 6/2004 | Chang et al. | 6,940,356 B2 | 9/2005 | McDonald et al. |
| 6,754,849 B2 | 6/2004 | Tamura | 6,941,336 B2 | 9/2005 | Mar |
| 6,757,882 B2 | 6/2004 | Chen et al. | 6,941,538 B2 | 9/2005 | Hwang et al. |
| 6,765,407 B1 | 7/2004 | Snyder | 6,944,018 B2 | 9/2005 | Caldwell |
| 6,768,337 B2 | 7/2004 | Kohno et al. | 6,949,811 B2 | 9/2005 | Miyazawa |
| 6,768,352 B1 | 7/2004 | Maher et al. | 6,949,984 B2 | 9/2005 | Siniscalchi |
| 6,769,622 B1 | 8/2004 | Tournemille et al. | 6,950,954 B1 | 9/2005 | Sullam et al. |
| 6,771,552 B2 | 8/2004 | Fujisawa | 6,950,990 B2 | 9/2005 | Rajarajan et al. |
| 6,774,644 B2 | 8/2004 | Eberlein | 6,952,778 B1 | 10/2005 | Snyder |
| 6,781,456 B2 | 8/2004 | Pradhan | 6,954,511 B2 | 10/2005 | Tachimori |
| 6,782,068 B1 | 8/2004 | Wilson et al. | 6,954,904 B2 | 10/2005 | White |
| 6,784,821 B1 | 8/2004 | Lee | 6,956,419 B1 | 10/2005 | Mann et al. |
| 6,785,881 B1 | 8/2004 | Bartz et al. | 6,957,180 B1 | 10/2005 | Nemecek |
| 6,788,116 B1 | 9/2004 | Cook et al. | 6,957,242 B1 | 10/2005 | Snyder |
| 6,788,221 B1 | 9/2004 | Ely et al. | 6,961,686 B2 | 11/2005 | Kodosky et al. |
| 6,788,521 B2 | 9/2004 | Nishi | 6,963,233 B2 | 11/2005 | Puccio et al. |
| 6,791,377 B2 | 9/2004 | Ilchmann et al. | 6,963,908 B1 | 11/2005 | Lynch et al. |
| 6,792,584 B1 | 9/2004 | Eneboe et al. | 6,966,039 B1 | 11/2005 | Bartz et al. |
| 6,798,218 B2 | 9/2004 | Kasperkovitz | 6,967,511 B1 | 11/2005 | Sullam |

| | | |
|---|---|---|
| 6,967,960 B1 | 11/2005 | Bross et al. |
| 6,968,346 B2 | 11/2005 | Hekmatpour |
| 6,969,978 B2 | 11/2005 | Dening |
| 6,970,844 B1 | 11/2005 | Bierenbaum |
| 6,971,004 B1 | 11/2005 | Pleis et al. |
| 6,973,400 B2 | 12/2005 | Cahill-O'Brien et al. |
| 6,975,123 B1 | 12/2005 | Malang et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,996,799 B1 | 2/2006 | Cismas et al. |
| 7,005,933 B1 | 2/2006 | Shutt |
| 7,009,444 B1 | 3/2006 | Scott |
| 7,010,773 B1 | 3/2006 | Bartz et al. |
| 7,015,735 B2 | 3/2006 | Kimura et al. |
| 7,017,145 B2 | 3/2006 | Taylor |
| 7,017,409 B2 | 3/2006 | Zielinski et al. |
| 7,020,854 B2 | 3/2006 | Killian et al. |
| 7,023,215 B2 | 4/2006 | Steenwyk |
| 7,023,257 B1 | 4/2006 | Sullam |
| 7,024,636 B2 | 4/2006 | Weed |
| 7,024,654 B2 | 4/2006 | Bersch et al. |
| 7,026,861 B2 | 4/2006 | Steenwyk |
| 7,030,513 B2 | 4/2006 | Caldwell |
| 7,030,656 B2 | 4/2006 | Lo et al. |
| 7,030,688 B2 | 4/2006 | Dosho et al. |
| 7,030,782 B2 | 4/2006 | Ely et al. |
| 7,034,603 B2 | 4/2006 | Brady et al. |
| 7,042,301 B2 * | 5/2006 | Sutardja ................. 331/176 |
| 7,047,166 B2 | 5/2006 | Dancea |
| 7,055,035 B2 | 5/2006 | Allison et al. |
| 7,058,921 B1 | 6/2006 | Hwang et al. |
| 7,073,158 B2 | 7/2006 | McCubbrey |
| 7,076,420 B1 | 7/2006 | Snyder et al. |
| 7,079,166 B1 | 7/2006 | Hong |
| 7,086,014 B1 | 8/2006 | Bartz et al. |
| 7,088,166 B2 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,098,414 B2 | 8/2006 | Caldwell |
| 7,099,818 B1 | 8/2006 | Nemecek |
| 7,100,133 B1 | 8/2006 | Meiyappan et al. |
| 7,103,108 B1 | 9/2006 | Beard |
| 7,109,978 B2 | 9/2006 | Gillespie et al. |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,133,140 B2 | 11/2006 | Lukacs et al. |
| 7,133,793 B2 | 11/2006 | Ely et al. |
| 7,138,841 B1 | 11/2006 | Li |
| 7,138,868 B2 | 11/2006 | Sanchez et al. |
| 7,139,530 B2 | 11/2006 | Kusbel |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,150,002 B1 | 12/2006 | Anderson et al. |
| 7,151,528 B2 | 12/2006 | Taylor et al. |
| 7,152,027 B2 | 12/2006 | Andrade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,199,783 B2 | 4/2007 | Wenstrand et al. |
| 7,200,507 B2 | 4/2007 | Chen et al. |
| 7,206,733 B1 | 4/2007 | Nemecek |
| 7,212,189 B2 | 5/2007 | Shaw et al |
| 7,221,187 B1 | 5/2007 | Snyder et al. |
| 7,227,389 B2 | 6/2007 | Gong et al. |
| 7,236,921 B1 | 6/2007 | Nemecek et al. |
| 7,250,825 B2 | 7/2007 | Wilson et al. |
| 7,256,588 B2 | 8/2007 | Howard et al. |
| 7,265,633 B1 | 9/2007 | Stiff |
| 7,266,768 B2 | 9/2007 | Ferlitsch et al. |
| 7,281,846 B2 | 10/2007 | McLeod |
| 7,282,905 B2 | 10/2007 | Chen et al. |
| 7,283,151 B2 | 10/2007 | Nihei et al. |
| 7,283,410 B2 | 10/2007 | Hsu et al. |
| 7,287,112 B1 | 10/2007 | Pleis et al. |
| 7,288,977 B2 | 10/2007 | Stanley |
| 7,290,244 B2 | 10/2007 | Peck et al. |
| 7,295,049 B1 | 11/2007 | Moyal et al. |
| 7,298,124 B2 | 11/2007 | Kan et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,324,380 B2 | 1/2008 | Negut et al. |
| 7,332,976 B1 | 2/2008 | Brennan |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,392,011 B1 | 6/2008 | Jacomb-Hood |
| 7,400,183 B1 | 7/2008 | Sivadasan et al. |
| 7,421,251 B2 | 9/2008 | Westwick et al. |
| 7,427,900 B2 * | 9/2008 | Manetakis et al. ............. 331/17 |
| 7,461,274 B2 | 12/2008 | Merkin |
| 7,466,307 B2 | 12/2008 | Trent, Jr. et al. |
| 7,542,533 B2 | 6/2009 | Jasa et al. |
| 7,554,847 B2 | 6/2009 | Lee |
| 7,579,895 B2 * | 8/2009 | Sun et al. ..................... 327/407 |
| 7,616,509 B2 | 11/2009 | Qureshi et al. |
| 7,809,545 B2 | 10/2010 | Ciolfi et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0010716 A1 | 1/2002 | McCartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll, Jr. |
| 2002/0099863 A1 | 7/2002 | Comeau et al. |
| 2002/0109722 A1 | 8/2002 | Rogers et al. |
| 2002/0116168 A1 | 8/2002 | Kim |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0121679 A1 | 10/2002 | Bazarjani et al. |
| 2002/0144099 A1 | 10/2002 | Muro, Jr. et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |

| | | | |
|---|---|---|---|
| 2002/0174411 A1 | 11/2002 | Feng et al. | |
| 2002/0191029 A1 | 12/2002 | Gillespie et al. | |
| 2003/0011639 A1 | 1/2003 | Webb | |
| 2003/0014447 A1 | 1/2003 | White | |
| 2003/0025734 A1 | 2/2003 | Boose et al. | |
| 2003/0033588 A1 | 2/2003 | Alexander | |
| 2003/0041235 A1 | 2/2003 | Meyer | |
| 2003/0056071 A1 | 3/2003 | Triece et al. | |
| 2003/0058469 A1 | 3/2003 | Buis et al. | |
| 2003/0061572 A1 | 3/2003 | McClannahan et al. | |
| 2003/0062889 A1 | 4/2003 | Ely et al. | |
| 2003/0066057 A1 | 4/2003 | RuDusky | |
| 2003/0080755 A1 | 5/2003 | Kobayashi | |
| 2003/0086300 A1 | 5/2003 | Noyes et al. | |
| 2003/0097640 A1 | 5/2003 | Abrams et al. | |
| 2003/0105620 A1 | 6/2003 | Bowen | |
| 2003/0126947 A1 | 7/2003 | Margaria | |
| 2003/0135842 A1 | 7/2003 | Frey et al. | |
| 2003/0149961 A1 | 8/2003 | Kawai et al. | |
| 2003/0199254 A1 | 10/2003 | Kusbel | |
| 2003/0229482 A1 | 12/2003 | Cook et al. | |
| 2004/0018711 A1 | 1/2004 | Madurawe | |
| 2004/0054821 A1 | 3/2004 | Warren et al. | |
| 2004/0153802 A1 | 8/2004 | Kudo et al. | |
| 2004/0205553 A1 | 10/2004 | Hall et al. | |
| 2004/0205617 A1 | 10/2004 | Light | |
| 2004/0205695 A1 | 10/2004 | Fletcher | |
| 2005/0024341 A1 | 2/2005 | Gillespie et al. | |
| 2005/0066152 A1 | 3/2005 | Garey | |
| 2005/0080579 A1 | 4/2005 | Cahill-O'Brien et al. | |
| 2005/0143968 A9 | 6/2005 | Odom et al. | |
| 2005/0156677 A1 | 7/2005 | Gramegna | |
| 2005/0240917 A1 | 10/2005 | Wu | |
| 2005/0248534 A1 | 11/2005 | Kehlstadt | |
| 2005/0270108 A1 | 12/2005 | Wilson et al. | |
| 2005/0280453 A1 | 12/2005 | Hsieh | |
| 2006/0015862 A1 | 1/2006 | Odom et al. | |
| 2006/0031768 A1 | 2/2006 | Shah et al. | |
| 2006/0032680 A1 | 2/2006 | Elias et al. | |
| 2006/0097991 A1 | 5/2006 | Hotelling et al. | |
| 2006/0122799 A1 | 6/2006 | Chen et al. | |
| 2006/0223454 A1 | 10/2006 | Westwick et al. | |
| 2006/0273804 A1 | 12/2006 | Delorme et al. | |
| 2007/0009072 A1 | 1/2007 | Jasa et al. | |
| 2007/0139074 A1 | 6/2007 | Reblewski | |
| 2007/0258458 A1 | 11/2007 | Kapoor | |
| 2008/0086668 A1 | 4/2008 | Jefferson et al. | |
| 2008/0095213 A1 | 4/2008 | Lin et al. | |
| 2008/0186052 A1 | 8/2008 | Needham et al. | |
| 2008/0259998 A1 | 10/2008 | Venkataraman et al. | |
| 2008/0294806 A1 | 11/2008 | Swindle et al. | |
| 2009/0066427 A1 | 3/2009 | Brennan | |
| 2009/0322305 A1 | 12/2009 | De Cremoux | |

FOREIGN PATENT DOCUMENTS

| | | | |
|---|---|---|---|
| EP | 0308583A2 A1 | 3/1989 | |
| EP | 368398 A1 | 5/1990 | |
| EP | 0450863A2 A1 | 10/1991 | |
| EP | 0499383A2 A1 | 8/1992 | |
| EP | 0639816A2 A1 | 2/1995 | |
| EP | 1170671A1 A1 | 1/2002 | |
| EP | 1205848 A1 | 5/2002 | |
| EP | 1191423A2 A1 | 2/2003 | |
| JP | 404083405 A1 | 3/1992 | |
| JP | 405055842 A1 | 3/1993 | |
| JP | 06021732 A1 | 1/1994 | |
| JP | 404095408 A1 | 3/2002 | |
| WO | 9532478 A1 | 11/1995 | |
| WO | PCT/US96/17305 | 6/1996 | |
| WO | PCT/US89/34376 | 8/1998 | |
| WO | PCT/US99/09712 | 2/1999 | |

OTHER PUBLICATIONS

USPTO Non-Final Rejection for U.S. Appl. No. 10/238,966 dated Jun. 30, 2008; 12 pages.
USPTO Non-Final Rejection for U.S. Appl. No. 10/238,966 dated Dec. 26, 2007; 12 pages.
USPTO Final Rejection for U.S. Appl. No. 10/238,966 dated Sep. 27, 2007; 9 pages.
USPTO Non-Final Rejection for U.S. Appl. No. 10/238,966 dated Apr. 14, 2007; 7 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Apr. 6, 2006; 8 pages.
USPTO Notice of Allowance for U.S. Appl. No. 10/033,027 dated Mar. 31, 2009; 7 pages.
USPTO Non-Final Rejection for U.S. Appl. No. 10/033,027 dated Dec. 18, 2008; 5 pages.
USPTO Final Rejection for U.S. Appl. No. 10/033,027 dated Jun. 8, 2007; 8 pages.
USPTO Non-Final Rejection for U.S. Appl. No. 10/033,027 dated Dec. 21, 2006; 31 pages.
USPTO Final Rejection for 10/033,027 dated Aug. 9, 2006; 6 pages.
USPTO Non-Final Rejection for 10/033,027 dated Apr. 26, 2006; 26 pages.
USPTO Final Rejection for 10/033,027 dated Oct. 31, 2005; 24 pages.
USPTO Non-Final. Rejection for 10/033,027 dated Apr. 20, 2005; 20 pages.
USPTO Non-Final Rejection for U.S. Appl. No. 10/033,027 dated Oct. 18, 2004; 17 pages.
USPTO Non-Final Rejection for U.S. Appl. No. 10/001,478 dated Oct. 20, 2008; 18 pages.
USPTO Final Rejection for U.S. Appl. No. 10/001,478 dated Jun. 4, 2008; 18 pages.
USPTO Non-Final Rejection for U.S. Appl. No. 10/001,478 dated Jan. 30, 2008; 19 pages.
USPTO Final Rejection for U.S. Appl. No. 10/001,478, dated Sep. 17, 2007; 15 pages.
USPTO Non-Final Rejection for U.S. Appl. No. 10/001,478 dated Apr. 2, 2007; 17 pages.
USPTO Final Rejection for U.S. Appl. No. 10/001,478 dated Sep. 5, 2006; 19 pages.
USPTO Non-Final Rejection for U.S. Appl. No. 10/001,478 dated Mar. 15, 2006; 19 pages.
USPTO Final Rejection for U.S. Appl. No. 10/001,478 dated Oct. 24, 2004; 15 pages.
USPTO Non-Final Rejection for U.S. Appl. No. 10/001,478 dated May 16, 2005; 13 pages.
USPTO Notice of Allowance for U.S. Appl. No. 10/002,217 dated Jan. 28, 2009; 4 pages.
USPTO Notice of Allowance for U.S. Appl. No. 10/002,217 dated Oct. 14, 2008; 6 pages.
USPTO Notice of Allowance for U.S. Appl. No. 10/002,217 dated Jun.6 2008; 7 pages.
USPTO Final Rejection for U.S. Appl. No. 10/002,217 dated Feb. 6, 2008; 10 pages.
USPTO Non-Final Rejection for U.S. Appl. No. 10/002,217 dated Aug. 3, 2007; 10 pages.
USPTO Final Rejection for U.S. Appl. No. 10/002,217, dated Mar. 7, 2007; 12 pages.
USPTO Non-Final Rejection for U.S. Appl. No. 10/002,217 dated Oct. 2, 2006; 21 pages.
USPTO Non-Final Rejection for U.S. Appl. No. 10/002,217 dated Apr. 3, 2006; 12 pages.
USPTO Final Rejection for U.S. Appl. No. 10/002,217 dated Nov. 17,2005; 17 pages.
USPTO Non-Final Rejection for U.S. Appl. No. 10/002,217 dated May 19, 2005; 15 pages.
USPTO Advisory Action for U.S. Appl. No. 10/001,477 dated Oct. 10, 2010; 3 pages.
"An Analog PPL-Based Clock and Data Recovery Circuit with High input Jitter Tolerance;" Sun, Reprinted from IEEE Journal of Solid-State Circuits, 1989; 4 pages.
"WP 3.5: An Integrated Time Reference;" Blauschild, Digest of Technical Papers, 1994; 4 pages.
"Micropower CMOS Temperature Sensor with Digital Output;" Bakker of al., IEEE Journal of Solid-State Circuits, 1996; 3 pages.

U.S. Appl. No. 09/964,991: "A Novel Band-Gap Circuit for Providing an Accurate Reference Voltage Compensated for Process State, Process Variations and Temperature," Kutz et al., filed on Sep. 26, 2001; 25 pages.
U.S. Appl. No. 09/842,966: "Precision Crystal Oscillator Circuit Used in Microcontroller," Monte Mar, filed on Apr. 25, 2001; 28 pages.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.
USPTO Non-Final Rejection for U.S. Appl. No. 09/975,115 dated Jan. 7, 2008; 30 pages.
USPTO Non-Final Rejection for U.S. Appl. No. 09/975,115, dated Jul. 31, 2007; 28 pages.
USPTO Final Rejection for U.S. Appl. No. 09/975,115, dated Feb. 21, 2007; 25 pages.
USPTO Non-Final Rejection for U.S. Appl. No. 09/975,115, dated Oct. 31, 2006; 19 pages.
USPTO Final Rejection for U.S. Appl. No. 091975,115, dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Sep. 6, 2006; 11 pages.
USPTO Advisory Action for U.S. Appl. No. 09/975,338 dated May 15, 2006; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No.10/008,096 dated Spe. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 25, 2005; 17 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Notice of Allowance for U.S. Appl. No. 10/008,096 dated Dec. 22, 2008; 24 pages.
USPTO Notice of Allowance for U.S. Appl. No. 09/975,105 dated Dec 24, 2006; 4 pages.
USPTO Final Rejection for U.S. Appl. No. 09/975,105 dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.

U.S. Appl. No. 09/943,062: "Apparatus and Method for Programmable Power Management in a Programmable Analog Circuit Block," Monte Mar, filed on Aug. 29, 2001; 46 pages.
U.S. Appl. No. 10/238,966: "Method for Parameterizing a User Module," Perrin at al., filed on Sep. 9, 2002; 41 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final Rejection for U.S. Appl. No. 10/324,455 dated Aug. 21, 2003; 4 pages.
USPTO Notice of Allowance for U.S. Appl. No. 09/998,859 dated Mar. 14, 2005; 6 pages.
USPTO Non-Final Rejection for U.S. Appl. No. 09/998,859 dated Nov. 4, 2004; 6 pages.
USPTO Final Rejection for U.S. Appl. No. 09/998,859 dated Nov. 19, 2003; 5 pages.
USPTO Non-Final Rejection for U.S. Appl. No. 09/998,859 dated May 28, 2003; 6 pages.
USPTO Non-Final Rejection for U.S. Appl. No. 09/998,859 dated May 15, 2003; 6 pages.
USPTO Notice of Allowance for U.S. Appl. No. 09/998,834 dated May 19, 2005; 7 pages.
USPTO Non-Final Rejection for U.S. Appl. No. 09/998,834 dated Sep. 20, 2004; 11 pages.
USPTO Notice of Allowance for U.S. Appl. No. 10/113,065 dated Apr. 6, 2006; 8 pages.
USPTO Final Rejection for U.S. Appl. No. 10/113,065 dated Oct. 26, 2005; 17 pages.
USPTO Non-Final Rejection for U.S. Appl. No. 10/113,065 dated May 20, 2005; 14 pages.
U.S. Appl. No. 09/207,912: "Circuit(s), Architecture and Method(s) for Operating and/or Tuning a Ring Oscillator," Monte Mar, filed on Dec. 9, 1998; 23 pages.
USPTO Notice of Allowance for U.S. Appl. No. 10/001,477 dated May 8, 2009; 6 pages
Bursky, "FPGA Combines Multiple Interfaces and Logic," Electronic Design, vol. 48 No. 20, pp. 74-78 (Oct. 2, 2000); 5 pages.
Anonymous, "Warp Nine Engineering—The IEEE 1284 Experts-F/Port Product Sheet," undated web page found at http://www.fapo.com/fport.htm; printed on Apr. 12, 2005; 2 pages.
Anonymous, "F/Port:Fast Parallel Port for the PC" Installation Manual Release 7.1, circa 1997, available for download from http://www.fapo.com/fport.htm; 25 pages.
Nam et al.; "Fast Development of Source-Level Debugging System Using Hardware Emulation"; IEEE 2000; 4 pages.
Huang et al.; "Iceberg: An Embedded In-Cicuit Emulator Synthesizer for Microcontrollers"; ACM 1999; 6 pages.
Khan et al.; "FPGA Architectures for Asic Hardware Emulators"; IEEE 1993; 5 pages.
Oh at al.; Emulator Environment Based on an FPGA Prototyping Board; IEEE 21-23; Jun. 2000; 6 pages.
Hong et al.; "An FPGA-Based Hardware Emulator for Fast Fault Emulation"; IEEE 1997; 4 pages.
Ching et al.; "An In-Curcuit-Emulator for TMS320C25"; IEEE 1994; 6 pages.
Pastermak et al.; "In-Circuit-Emulation in ASIC Architecture Core Designs"; IEEE 1989; 4 pages.
Melear; "Using Background Modes for Testing, Debugging and Emulation of Microcontrollers"; IEEE 1.997; 8 pages.
Walters, Stephen; "Computer-Aided Prototyping for ASIC-Based Systems", 1991, IEEE Design & Test of Computers; vol. 8, Issue 2; 8 pages.
Anonymous; "Jeeni JTAG EmbeddedICE Ethernet Interface"; Aug. 1999; Embedded Performance, inc.; 3 pages.
Sedory; "A Guide to Debug"; 2004; retrieved on May 20, 2005; 7 pages.
"Microsoft Files Summary Judgement Motions"; Feb. 1999; Microsoft PressPass; retrieved on May 20, 2005 from http://www.microsoft.com/presspass/press/1999/feb99/Feb99/Calderaprasp; 3 pages.
Xerox; "Mesa Debugger Documentation"; Apr. 1979; Xerox Systems Development Department; Version 5.0; 33 pages.

Stailman et al.; "Debugging with GDB the GNU Source-Level Debugger"; Jan. 1994; retrieved on May 2, 2005 from http://www.cs.utah.edu; 4 pages.

Wikipedia.org; "Von Neumann architecture"; retrieved from http://en.wikipedia.org/wiki/Von_Neumann_architecture on Jan. 22, 2007; 4 pages.

Stan Augarten; "The Chip Collection—Introduction—Smithsonian Institute"; "State of the Art"; "The First 256-Bit Static RAM"; retrieved on Nov. 14, 2005 from http://smithsonianchips.si.edu/augarten/p24.htm; 2 pages.

"POD—Piece of Data, Plain Old Documentation, Plain Old Dos . . ."; retrieved on Nov. 14, 2005 from http://www.auditmypc.com/acronym/POD.asp; 2 pages.

USPTO Non-Final Rejection for 09/989,767 dated Oct. 6, 2004; 15 pages.

USPTO Final Rejection for 09/989,771 dated Feb. 27,2007; 8 pages.
USPTO Final Rejection for 09/989,771 dated Mar. 28, 2006; 9 pages.
USPTO Final Rejection for 09/989,771 dated Apr. 6, 2005; 7 pages.
USPTO Final Rejection for 09/989,771 dated Dec. 10, 2008; 12 pages.
USPTO Final Rejection for 09/989,771 dated Dec. 27, 2007; 15 pages.
USPTO Non-Final Rejection for 09/989,771 dated May 28, 2008; 14 pages.
USPTO Non-Final Rejection for 09/989,771 dated Jul. 16, 2007; 14 pages.
USPTO Non-Final Rejection for 09/989,771 dated Aug. 23, 2006; 7 pages.
USPTO Non-Final Rejection for 09/989,771 dated Sep. 12, 2005; 7 pages.
USPTO Non-Final Rejection for 09/989,771 dated Sep. 22, 2004; 7 pages.
USPTO Final Rejection for 09/989,765 dated Apr. 3, 2007; 12 pages.
USPTO Final Rejection for 09/989,765 dated Apr. 4, 2008; 16 pages.
USPTO Final Rejection for 09/989,765 dated Apr. 17, 2006; 12 pages.
USPTO Non-Final Rejection for 09/989,765 dated Sep. 19, 2007; 14 pages.
USPTO Non-Final Rejection for 09/989,765 dated Sep. 26, 2008; 17 pages.
USPTO Non-Final Rejection for 09/989,765 dated Oct. 2, 2006; 13 pages.
USPTO Non-Final Rejection for 09/989,765 dated Oct. 5, 2005; 9 pages.
USPTO Final Rejection for 09/989,782 dated Jul. 9, 2008; 10 pages.
USPTO Final Rejection for 09/989,782 dated Jul. 24, 2007; 9 pages.
Uspto Final Rejection for 09/989,782 dated Sep. 21, 2006; 10 pages.
Uspto Final Rejection for 09/989,782 dated Nov. 3, 2005; 11 pages.
Uspto Non-Final Rejection for 09/989,782 dated Jan. 29, 2007; 9 pages.
Uspto Non-Final Rejection for 09/989,782 dated Mar. 28, 2006; 8 pages.
Uspto Non-Final Rejection for 09/989,782 dated Apr. 29, 2005; 11 pages.
Uspto Non-Final Rejection for 09/989,782 dated Oct. 6, 2004; 11 pages.
Uspto Non-Final Rejection for 09/989,782 dated Nov. 26, 2004; 10 pages.
Uspto Non-Final Rejection for 09/989,782 dated Dec. 14, 2007; 8 pages.
Uspto Final Rejection for 09/989,765 dated Mar. 31, 2009; 18 pages.
Uspto Final Rejection for 09/989,778 dated Mar. 16, 2009; 26 pages.
Goodenough, F. "Analog Counterparts of FPGAS Ease System Design" Electronic Design, Penton Publishing, Cleveland, OH, US vol. 42, No. 21, Oct. 14, 1994; 10 pages.
Harbaum, T. et al. "Design of a Flexible Coprocessor Unit" Proceedings of the Euromicro Conference, XX XX, Sep. 1999; 10 pages.
USPTO U.S. Appl. No. 09/924,734: "Programmable Microcontroller (PSoC) Architecture (Mixed Analog/Digital)"; Snyder et al., filed on Aug. 7, 2001; 28 pages.
USPTO U.S. Appl. No. 09/909,045: "Digital Configurable Macro Architecture," Warren Snyder, filed on Jul. 18, 2001; 37 pages.

USPTO U.S. Appl. No. 09/909,109: "Configuring Digital Functions in a Digital Configurable Macro Architecture," Warren Snyder, filed on Jul. 18, 2001; 38 pages.
USPTO U.S. Appl. No. 09/909,047: "A Programmable Analog System Architecture," Monte Mar, filed on Jul. 18, 2001; 60 pages.
USPTO U.S. Appl. No. 09/930,021: "Programmable Methodology and Architecture for a Programmable Analog System"; Mar et al., filed on Aug. 14, 2001; 87 pp. 17.
USPTO U.S. Appl. No. 09/969,311: "Method for Synchronizing and Resetting Clock Signals Supplied to Multiple Programmable Analog Blocks," Bert Sullam, filed on Oct. 1, 2001; 57 pages.
USPTO U.S. Appl. No. 09/875,599: "Method and Apparatus for Programming a Flash Memory," Warren Snyder, filed on Jun. 5, 2001; 23 pages.
USPTO U.S. Appl. No. 09/975,115: "In-System Chip Emulator Architecture," Snyder et al., filed on Oct. 10, 2001; 38 pages.
USPTO U.S. Appl. No. 09/953,423: "A Configurable Input/Output Interface for a Microcontroller," Warren Snyder, filed on Sep. 14, 2001; 28 pages.
USPTO U.S. Appl. No. 09(893,050: "Multiple Use of Microcontroller Pad," Kutz et al., filed on Jun. 26, 2001; 21 pages.
USPTO U.S. Appl. No. 09/929,891: "Programming Architecture for a Programmable Analog System," Mar at al., filed on Aug. 14, 2001; 82 pp. --,.
USPTO U.S. Appl. No. 09/969,313: "Architecture for Synchronizing and Resetting Clock Signals Supplied to Multiple Analog Programmable Analog Blocks," Bert Sullam, filed on Oct. 1, 2001; 50 pages.
USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 11 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 10 pages.
Hintz et al., "Microcontrollers", 1992, McGraw-Hill; 11 pages.
Ganapathy et al., "Hardware Emulation for Functional Verification of K5", Jun. 1996, 33rd Design Automation Conference Proceedings, Jun. 3-7, 1996; 4 pages.
U.S. Appl. No. 60/243,708 "Advanced Programmable Microcontroller Device"; Snyder et al., filed on Oct. 26, 2000; 277 pages.
"Webster's Third New International Dictionary", 1996, G. & C. Merriam Company; 3 pages (including pages 1328-1329).
USPTO Advisory Action for U.S. Appl. No. 09/998,848 dated Sep. 7, 2005; 3 pages.
USPTO U.S. Appl. No. 09/957,084: "A Crystal-Less Oscillator with Trimmable Analog Current Control for increased Stability," Mar et al., filed on Sep. 19, 2001; 28 pages.
USPTO U.S. Appl. No. 10/011,214: "Method and Circuit for Synchronizing a Write Operation between an On-Chip Microprocessor and an On-Chip Programmable Analog Device Operating at Different Frequencies," Sullam et al., filed on Oct. 25, 2001; 49 pages.
USPTO U.S. Appl. No. 09/972,319: "Method for Applying Instructions to Microprocessor in Test Mode," Warren Snyder, filed on Oct. 5, 2001; 31 pages.
USPTO U.S. Appl. No. 09/972,003: "Test Architecture for Microcontroller Providing for a Serial Communication Interface," Warren Snyder, filed on Oct. 5, 2011; 32 pages.
USPTO U.S. Appl. No. 091972,133: "Method for Entering Circuit Test Mode," Warren Snyder, filed on Oct. 5, 2001; 30 pages.
USPTO U.S. Appl. No. 09/973,535: "Architecture for Decimation Algorithm," Warren Snyder, filed on Oct. 9, 2001; 26 pages.
USPTO U.S. Appl. No. 09/977,111: "A Frequency Doubler Circuit with Trimmable Current Control," Shutt et al., filed on Oct. 11, 2001; 35 pages.
USPTO U.S. Appl. No. 10/272,231: "Digital Configurable Macro Architecture," Warren Snyder, filed on Oct. 15, 2002; 36 pages.
USPTO U.S. Appl. No. 11/125,554: "A Method for a Efficient Supply to a Microcontroller," Kutz et al., filed on May 9, 2005; 1 page.
USPTO U.S. Appl. No. 09/855,868: "Protecting Access to Microcontroller Memory Blocks," Warren Snyder, filed on May 14, 2001; 28 pages.

USPTO U.S. Appl. No. 09/887,923: "Novel Method and System for interacting between a Processor and a Power on Reset to Dynamically Control Power States in a Microcontroller," Kutz et al., filed on Jun. 22, 2001; 44 pages.
USPTO U.S. Appl. No. 10/000,383: "System and Method of Providing a Programmable Clock Architecture for an Advanced Microcontroller," Sullam et al., filed on Oct. 24, 2001; 34 pages.
USPTO U.S. Appl. No. 10/001,477: "Breakpoint Control in an In-Circuit Emulation System," Roe et al., filed on Nov. 1, 2001; 43 pages.
USPTO U.S. Appl. No. 10/004,197: "in-Circuit Emulator with Gatekeeper Based Halt Control," Nemecek et al., filed on Nov. 14, 2001; 47 pages.
USPTO U.S. Appl. No. 10/004,039: "In-Circuit Emulator with Gatekeeper for Watchdog Timer," Nemecek et al., filed on Nov. 14, 2001; 46 pages.
USPTO U.S. Appl. No. 10/002,217: "Conditional Branching in an In-Circuit Emulation System," Craig Nemecek, filed on Nov. 1, 2001; 43 pages.
USPTO U.S. Appl. No. 10/001,568: "Combined In-Circuit Emulator and Programmer," Nemecek et al., filed on Nov. 1, 2001; 47 pages.
USPTO U.S. Appl. No. 10/001,478: "in-Circuit Emulator and Pod Synchronized Boot," Nemecek et al., filed on Nov. 1, 2001; 44 pages.
USPTO U.S. Appl. No. 09/887,955: "Novel Power on Reset Circuit for Microcontroller," Kutz et al., filed on Jun. 22, 2001; 42 pages.
USPTO U.S. Appl. No. 09/826,397: "Method and Circuit for Allowing a Microprocessor to Change its Operating Frequency on-the-Fly," Bert Sullam, filed on Apr. 2, 2001; 24 pages.
USPTO U.S. Appl. No. 09/893,048: "A Microcontroller having an On-Chip High Gain Amplifier," Kutz et al., filed on Jun. 26, 2001; 22 pages.
USPTO U.S. Appl. No. 09/912,768: "A Microcontroller having a Dual Mode Relax Oscillator that is Trimmable," James Shutt; filed on Jul. 24, 2001; 33 pages.
USPTO U.S. Appl. No. 09/922,419: "A Power Supply Pump Circuit for a Microcontroller," Kutz et al., filed on Aug. 3, 2001; 38 pages.
USPTO U.S. Appl. No. 09/922,579: "A Method for a Efficient Supply to a Microcontroller," Kutz et al., filed on Aug. 3, 2001; 37 pages.
USPTO U.S. Appl. No. 09/923,461: "Non-Interfering Multiply-Mac (Multiply Accumulate) Circuit," Warren Snyder, filed on Aug. 6, 2001; 25 pages.
USPTO U.S. Appl. No. 09/935,454: "Method and Apparatus for Local and Global Power Management in a Programmable Analog Circuit," Monte Mar, filed on Aug. 22, 2001; 51 pages.
"Pod-Wikipedia, the free encyclopedia"; retrieved on Nov. 14, 2005 from http://en.wikipedia.org/wiki/Pod; 3 pages.
"pod-defintion by dict.die.net"; retrieved on Nov. 14, 2005 from http://dict.die.net/pod; 2 pages.
"In-Curcuit Emulators—descriptions of the major ICEs around"; retrieved on Nov. 14, 2005 from http://www.algonet.se/-staffann/developer/emulator.htm; 6 pages.
USPTO U.S. Appl. No. 091975,104: "Capturing Test/Emulation and Enabling Real-Time Debugging Using FPGA for In-Circuit Emulation," Warren Snyder, filed on Oct. 10, 2001; 35 pages.
USPTO Non-Final Rejection for U.S. Appl. No. 09/989,767 dated Jul. 24, 2008; 21 pages.
Anonymous; "Using Debug"; 1999; Prentice-Hall Publishing; 20 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.
Microsoft Press Computer User's Dictionary; 1998; 3 pages (including p. 18).
Sreeram Duvvuru and Siamak Arya, "Evaluation of a Branch Target Address Cache," 1995; IEEE; 8 pages.
Andrew S. Tanenbaum with contributions from James R. Goodman, "Structured Computer Organization," 1999, Prentice Hall, Fourth Edition; 32 pages.
USPTO U.S. Appl. No. 09/975,338: "Method for Breaking Execution of a Test Code in Dut and Emulator Chip Essentially Simultaneously and Handling Complex Breakpoint Events," Nemecek at al., filed on Oct. 10, 2001; 34 pages.

USPTO U.S. Appl. No. 09/975,030: "Emulator Chip-Board Architecture for Interface," Snyder et al., filed on Oct. 10, 2001; 37 pages.
Wikipedia—Main Page, retrieved on Mar. 8, 2006 from http:/len.wikipedia.org/wiki/Main_Page and http://en.wikipedia. org/wiki/Wikipedia:Introduction; 5 pages.
Wikipedia - Processor register, retrieved on Mar. 7, 2006 from http://en.wikipedia.org/wiki/Processor_register; 4 pages.
Jonathan B. Rosenburg, "How Debuggers Work" John Wiley & Sons, Inc. 1996; 259 pages.
Dahl, et al.; "Emulation of the Sparcle Microprocessor with the MIT Virtual Wires Emulation System"; 1994; IEEE; 9 pages.
Bauer et al.; "A Reconfigurable Logic Machine for Fast Event-Driven Simulation"; Jun. 1998; Design Automation Conference Proceedings; 8 pages.
USPTO U.S. Appl. No. 09/975,105: "Host to FPGA Interface in an In-Circuit Emulation System," Craig Nemecek, filed on Oct. 10, 2004; 44 pages.
USPTO Advisory Action for U.S. Appl. No. 09/994,601 dated May 23, 2006; 3 pages.
USPTO Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Non-Final Rejection for U.S. Appl. No. 09/989,767 dated Jul. 2, 2007; 22 pages.
USPTO Notice of Allowance for U.S. Appl. No. 09/992,076 dated Mar. 26, 2008; 23 pages.
USPTO Notice of Allowance for U.S. Appl. No. 09/992,076 dated Jul. 29, 2008; 6 pages.
USPTO Advisory Action for 09/989,778 dated May 15, 2006; 4 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S.Appl. No. 09/989,778 dated Sep. 1, 2005; 10 pages.
USPTP Non-Final Rejection for U.S. Appl. No. 09/989,778 dated Sep. 18, 2006; 11 pages.
USPTO Final Rejection for U.S. Appl. No. 09/998,848 dated Jun. 14, 2005; 17 pages.
USPTO Final Rejection for U.S. Appl. No. 09/998,848 dated Jul. 25,2006; 16 pages.
USPTO Final Rejection for U.S. Appl. No. 09/998,848 dated Aug. 10, 2007; 14 pages.
USPTO Final Rejection for 09/998,848 dated Nov. 24, 2008; 15 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Final Rejection for 09/989,767 dated Jan. 11, 2007; 12 pages.
USPTO Final Rejection for U.S. Appl. No. 09/989,767 dated Jan. 15, 2009; 21 pages.
USPTO Final Rejection for U.S. Appl. No. 09/989,767 dated Mar. 6, 2006; 15 pages.
USPTO Final Rejection for U.S. Appl. No. 09/989,767 dated Apr. 6, 2005; 13 pages.

USPTO Final Rejection for U.S. Appl. No. 09/989,767 dated Dec. 27, 2007; 21 pages.
USPTO Non-Final Rejection for U.S. Appl. No. 09/989,767 dated Jul. 17, 2006; 12 pages.
USPTO Notice of Allowance for U.S. Appl. No. 09/992,076 dated Nov. 13, 2008; 15 pages.
USPTO Final Rejection for U.S. Appl. No. 09/994,601 dated May 18, 2007; 17 pages.
USPTO Notice of Allowance for U.S. Appl. No. 09/992,076 dated Nov. 29, 2007; 8 pages.
USPTO Final Rejection for U.S. Appl. No. 09/992,076 dated Jan. 30, 2007; 32 pages.
USPTO Non-Final Rejection for U.S. Appl. No. 09/992,076 dated Aug. 10, 2006; 19 pages.
USPTO Final Rejection for U.S. Appl. No. 09/992,076 dated Mar. 17, 2006; 16 pages.
USPTO Non-Final Rejection for U.S. Appl. No. 09/992,076 dated Nov. 21, 2005; 29 pages.
USPTO Non-Final Rejection for U.S. Appl. No. 09/992,076 dated Jun. 1, 2005; 20 pages.
USPTO Notice of Allowance for U.S. Appl. No. 09/994,600 dated Nov. 12, 2008; 35 pages.
USPTO Notice of Allowance for U.S. Appl. No. 09/994,600 dated May 14, 2008; 22 pages.
USPTO Final Rejection for U.S. Appl. No. 09/994,600 dated Oct. 17, 2007; 13 pages.
USPTO Non-Final Rejection for U.S. Appl. No. 09/994,600 dated May 15, 2007; 14 pages.
USPTO Final Rejection for U.S. Appl. No. 09/994,600 dated Dec. 8, 2006; 14 pages.
USPTO Non-Final Rejection for U.S. Appl. No. 09/994,600 dated Jul. 17, 2006; 14 pages.
USPTO Final Rejection for U.S. Appl. No. 09/994,600 dated Feb. 13, 2006; 13 pages.
USPTO Non-Final Rejection for U.S. Appl. No. 09/994,600 dated Aug. 23, 2005; 13 pages.
USPTO Final Rejection for U.S. Appl. No. 09/994,600 dated May 4, 2005; 16 pages.
USPTO Non-Final Rejection for U.S. Appl. No. 09/994,600 dated Oct. 21, 2004; 37 pages.
USPTO Notice of Allowance for U.S. Appl. No. 10/001,477 dated Nov. 10, 2008; 7 pages.
USPTO Final Rejection for U.S. Appl. No. 10/00,477 dated Jun. 30, 2008; 19 pages.
USPTO Non-Final Rejection for U.S. Appl. No. 10/001,477 dated Dec. 6, 2007; 17 pages.
USPTO Final Rejection for U.S. Appl. No. 10/001,477 dated Jul. 23, 2007; 19 pages.
USPTO Non-Final Rejection for U.S. Appl. No. 10/001,477 dated Jan. 22, 2007; 17 pages.
USPTO Final Rejection for U.S. Appl. No. 10/001,477 dated Aug. 24, 2006; 15 pages.
USPTO Non-Final Rejection for U.S. Appl. No. 10/001,477 dated Mar. 2, 2006; 17 pages.
USPTO Final Rejection for U.S. Appl. No. 10/001,477 dated Oct. 24, 2005; 18 pages.
USPTO Non-Final Rejection for U.S. Appl. No. 10/001,477 dated May 11, 2005; 31 pages.
Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.
Julio Faura et al.; "A Novel Mixed Signal Programmable Device With On-Chip Microprocessor", 1997, IEEE 1997 Custom Integrated Circuits Conference; 4 pages.
Monte Mar, Bert Sullam, Eric Blom; "An architecture for a configurable Mixed-signal device", 2003, IEEE Journal of Solid-State Circuits, vol. 3; 4 pages.
Robinson, Gordon D; "Why 1149.1 (JTAG) Really Works", May 1994, Conference Proceedings Electro/94 International, May 10-12, 1994, Combined Volumes; 6 pages.
USPTO Non-Final Rejection for U.S. Appl. No. 09/994,601 dated Oct. 4, 2007; 20 pages.

"PSoC designer: Integrated development environment, getting started 25-minute tutorial, version 1.0", Cypress Microsystems., Cypress Microsystems, Inc. CMS10006A, Jul. 3, 2001; 25 pages.
"PSoC technology complete changes 8-bit MCU system design", Cypress Microsystems, Inc. retrieved from <http>://www.archive.org/web/20010219005250/http://cypressmicro.com- /t.>, Feb. 19, 2001; 21 pages.
Specks et al., "A Mixed Digital-Analog 16B Microcontroller with 0.5MB Flash Memory, On-Chip Power Supply, Physical Nework Interface, and 40V I/O for Automotive Single-Chip Mechatronics," IEEE, Feb. 9, 2000; 1 page.
Hsieh et al., "Modeling Micro-Controller Peripherals for High-Level Co-Simulation and Synthesis," IEEE, 1997; 4 pages.
USPTO Notice of Allowance for U.S. Appl. No. 09/989,777 dated Nov. 4, 2008; 3 pages.
USPTO Notice of Allowance for U.S. Appl. No. 09/989,77 dated Sep. 15, 2008; 28 pages.
USPTO Notice of Allowance for U.S. Appl. No. 091989,777 dated Jul. 7, 2008; 23 pages.
USPTO Final Rejection for U.S. Appl. No. 09/989,777 dated Jan. 30, 2008; 14 pages.
USPTO Non-Final Rejection for U.S. Appl. No. 09/989,777 dated Sep. 11, 2007; 18 pages.
USPTO Final Rejection for U.S. Appl. No. 09/989,777 dated Mar. 13, 2007; 24 pages.
USPTO Non-Final Rejection for U.S. Appl. No. 09/989,777 dated Sep. 13, 2006; 18 pages.
USPTO Non-Final Rejection for U.S. Appl. No. 09/989,777 dated Apr. 11, 2006; 21 pages.
USPTO Final Rejection for U.S. Appl. No. 09/989,777 dated Dec. 21, 2005; 29 pages.
USPTO Non-Final Rejection for U.S. Appl. No. 09/989,777 dated Jul. 5, 2005; 36 pages.
USPTO Notice of Allowance for U.S. Appl. No. 09/994,601 dated Dec. 22, 2008; 15 pages.
USPTO Final Rejection for U.S. Appl. No. 09/994,601 dated Apr. 17, 2008; 24 pages.
USPTO U.S. Appl. No. 10/033,027: "Microcontrollable Programmable System on a Chip," Warren Snyder; filed on Oct. 22, 2001; 117 pages.
USPTO U.S. Appl. No. 10/803,030: "Programmable Microcontrollabie Architecture (Mixed Analog/ Digital)," Snyder et al., filed on Mar. 16, 2004; 13 pages.
USPTO Notice of Allowance for U.S. Appl. No. 09/930,021 dated Nov. 26, 2004; 4 pages.
USPTO Final Rejection for U.S. Appl. No. 091930,021 dated Aug. 31, 2004; 8 pages.
USPTO Non-Final Rejection for U.S. Appl. No. 09/930,021 dated Apr. 26, 2004; 6 pages.
USPTO Miscellaneous Action with SSP for U.S. Appl. No. 09/930,021 dated Oct. 1, 2001; 1 page.
USPTO Notice of Allowance for U.S. Appl. No. 09/953,423 dated Jul. 12, 2004; 6 pages.
USPTO Non-Final Rejection for U.S. Appl. No. 09/953,423 dated Feb. 6, 2004; 5 pages.
USPTO Notice of Allowance for U.S. Appl. No. 09/957,084 dated May 18, 2004; 5 pages.
USPTO Final Rejection for U.S. Appl. No. 09/957,084 dated Jan. 29, 2004; 8 pages.
USPTO Non-Final Rejection for U.S. Appl. No. 09/957,084 dated Aug. 27, 2003; 8 pages.
USPTO Final Rejection for U.S. Appl. No. 09/957,084 dated Apr. 23, 2003; 8 pages.
USPTO Non-Final Rejection for U.S. Appl. No. 09/957,084 dated Aug. 23, 2002; 6 pages.
USPTO Notice of Allowance for U.S. Appl. No. 09/969,313 dated Oct. 4, 2005; 6 pages.
USPTO Non-Final Rejection for U.S. Appl. No. 09/969,313 dated May 6, 2005; 9 pages.
USPTO Requirement for Restriction/Election for U.S. Appl. No. 09/969,313 dated Mar. 18, 2005; 6 pages.
USPTO Notice of Allowance for U.S. Appl. No. 09/969,311 dated Mar. 1, 2005; 4 pages.

USPTO Non-Final Rejection for U.S. Appl. No. 09/969,311 dated Sep. 21, 2004; 4 pages.
USPTO Advisory Action for U.S. Appl. No. 09/969,311 dated Jul. 21, 2003; 2 pages.
USPTO Final Rejection for U.S. Appl. No. 09/969,311 dated Apr. 7, 2003; 7 pages.
USPTO Non-Final Rejection for U.S. Appl. No. 09/969,311 dated Nov. 6, 2002; 8 pages.
USPTO Notice of Allowance for U.S. Appl. No. 09/972,319 dated Dec. 30, 2004; 4 pages.
USPTO Non-Final Rejection for U.S. Appl. No. 09/972,319 dated Sep. 16, 2004; 9 pages.
USPTO Notice of Allowance for U.S. Appl. No. 09/972,003 dated Jul. 14, 2004; 4 pages.
USPTO Requirement for Restriction/Election for U.S. Appl. No. 09/972,003 dated May 6, 2004; 4 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Notice of Allowance for U.S. Appl. No. 09/972,133 dated Jun. 9, 2006; 6 pages.
USPTO Final Rejection for U.S. Appl. No. 09/972,133 dated Mar. 30, 2006; 8 pages.
USPTO Non-Final Rejection for U.S. Appl. No. 09/972,133 dated Nov. 25, 2005; 9 pages.
USPTO Advisory Action for U.S. Appl. No. 09/972,133 dated Aug. 31, 2005; 3 pages.
USPTO Final Rejection for U.S. Appl. No. 09/972,133 dated Jun. 29, 2005; 10 pages.
USPTO Non-Final Rejection for U.S. Appl. No. 09/972,133 dated Mar. 8, 2005; 9 pages.
USPTO Notice of Allowance for U.S. Appl. No. 09/975,104 dated Oct. 19, 2006; 6 pages.
USPTO Non-Final Rejection for U.S. Appl. No. 09/975,104 dated Jun. 16, 2006; 8 pages.
USPTO Final Rejection for U.S. Appl. No. 09/975,104 dated Feb. 15, 2006; 7 pages.
USPTO Non-Final Rejection for U.S. Appl. No. 09/975,104 dated Aug. 16, 2005; 6 pages.
USPTO Non-Final Rejection for U.S. Appl. No. 09/975,104 dated Mar. 21, 2005; 7 pages.
USPTO Notice of Allowance for U.S. Appl. No. 09/975,030 dated Feb. 6, 2006; 7 pages.
USPTO Non-Final Rejection for U.S. Appl. No. 09/975,030 dated Oct. 20, 2005; 7 pages.
USPTO Non-Final Rejection for U.S. Appl. No. 09/975,030 dated Mar. 29, 2005; 13 pages.
USPTO Notice of Allowance for U.S. Appl. No. 09/977,111 dated Sep. 28, 2006; 6 pages.
USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; 5 pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages.
USPTO Notice of Allowance for U.S. Appl. No. 09/875,599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 091875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No.10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2006; 9 pages.
USPTO Final Rejection for U.S. Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 091893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.

USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchial System Test by an IEEE 1149.5 MTM-Bus Slave-Module Interface Core," IEEE, 2000; 14 pages.
Haberi et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores," 1999, IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT9OSC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent Information Ltd; 2002; 2 pages.
Morrison, "IBM Eyes Merchant Packaging Services," Jul. 13, 1998; Electronic News <http://www.findarticles.com>; 4 pages.
Charles, Jr. et al., "Wirebonding: Reinventing the Process for MCMs," Apr. 1998; IEEE 7th International Conference on Multichip Modules and High Density Packaging; 3 pages.
Tran et af., "Fine Pitch and Wirebonding and Reliability of Aluminum Capped Copper Bond Pads," May 2000, IEEE Electronic Components and Technology Conference; 8 pages.
Song et al., "A 50% Power Reduction Scheme for CMOS Relaxation Oscillator," IEEE, 1999; 4 pages.
"Electronic Circuit Protector-Circuit Breaker;" IBM Technical Disclosure Bulletin; vol. 36, Issue 8, Aug. 1, 1993; 1 page.
USPTO Final Rejection for U.S. Appl. No. 10/001,478 dated Apr. 20, 2009; 16 pages.
USPTO Notice of Allowance for U.S. Appl. No. 09/994,600 dated Apr. 3, 2009; 5 pages.
USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.
USPTO U.S. Appl. No. 09/989,815: "A Data Driven Method and System for Monitoring Hardware Resource Usage for Programming an Electric Device," Bartz et al., filed on Nov. 19, 2001; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 09/989,762 dated Jan. 26, 2007; 13 pages.
USPTO Non-Final Rejection for U.S. Appl. No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
USPTO U.S. Appl. No. 09/275,336: "Programmable Oscillator Scheme," Mar et al., filed on Mar. 24, 1999; 25 pages.
USPTO U.S. Appl. No. 09/721,316: "Programmable Oscillator Scheme," Mar et al., filed on Nov. 22, 2000; 26 pages.
USPTO U.S. Appl. No. 10/324,455: "Programmable Oscillator Scheme," Mar et al., filed on Dec. 20, 2002; 23 pages.
USPTO U.S. Appl. No. 09/998,859: "A System and a Method for Checking Lock Step Consistency between in Circuit Emulation and a Microcontroller while Debugging Process is in Progress," Craig Nemecek, filed on Nov. 15, 2001; 33 pages.
USPTO U.S. Appl. No. 09/998,834: "A System and a Method for Communication between and Ice and a Production Microcontroller while in a Haft State," Craig Nemecek, filed on Nov. 15, 2001; 33 pages.
USPTO U.S. Appl. No. 10/113,065: "System and Method for Automatically Matching Components in a Debugging System," Nemecek et al., filed on Mar. 29, 2002; 32 pages.
USPTO U.S. Appl. No. 09/989,574 : "Method and System for using a Graphics user Interface for Programming an Electronic Device," Bartz et al., filed on Nov. 19, 2001; 43 pages.
USPTO U.S. Appl. No. 09/989,816: "Datasheet Browsing and Creation with Data-Driven Datasheet Tabs within a Microcontroller Design Tool," Bartz et al., filed on Nov. 19, 2001; 55 pages.
"New Object Domain R3 Beta Now Available (Build 134)!" Mar. 13, 2001; <http://web.archive.org/web/200100331202605/www.objectdomain.com/domain30/index.html>; 2 pages.
"OMG XML Metadata Interchange (CMI) Specifications" 2000; 17 pages.
Electronic Tools Company; E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http:// xml.coverpages.org on Mar. 23, 2005; 5 pages.

Microsoft Computer Dictionary "ActiveX" 2002; Microsoft Press; 5th Edition; 3 pages.

Wikipedia "XML" retrieved on Jan. 29, 2007 from http://en.wikipedia.org/wiki/XML; 16 pages.

"VHDI Samples" retrieved on Jan. 29, 2007 from http://www.csee.umbc.edu/help/VHOL/samples/samples.shtml; 10 pages.

Anonymous, "Lotus Notes FAQ -- How do you generate unique document numbers?" Sep. 19, 1999; retrieved from www.keysolutions.com on Jul. 9, 2008; 1 page.

Ashok Bindra, "Programmable SoC Delivers A New Level Of System Flexibility"; Electronic Design; Nov. 6, 2000; 11 pages.

Cypress MicroSystem, Inc. Cypress Customer Forums' retrieved from <http://www.cypress.com/forums/messageview>; Nov. 30, 2004; 1 page.

Cypress MicroSystem, Inc. "PsoC Designer: Integrated Development Environment User Guide"; Rev, 1.18; Sep. 8, 2003; 193 pages.

Hamblen, "Rapid Prototyping Using Field-Programmable Logic Devices" Jun. 2000, IEEE; 9 pages.

USPTO Final Rejection for U.S. Appl. No. 09/943,062 dated Apr. 30, 2004; 9 pages.

Snyder et al., "Xilinx's A-to-Z Systems Platform" Cahners Microprocessor, The Insider's Guide to Microprocessor Hardware, Feb. 6, 2001; 6 pages.

"PSoC Technology Completely Changes 8-bit Mcu System Design" Cypress MicroSystem, Inc, Feb. 19, 2001; 21 pages.

USPTO Non-Final Rejection for U.S. Appl. No. 09/943,062 dated Dec. 8, 2003; 9 pages.

USPTO Advisory Action for U.S. Appl. No. 09/943,062 dated Sep. 25, 2003; 3 pages.

USPTO Final Rejection for U.S. Appl. No. 09/943,062 dated Jun. 6, 2003; 8 pages.

USPTO Non-Final Rejection for U.S. Appl. No. 09/943,062 dated Jan. 27, 2003; 7 pages.

USPTO Non-Final Rejection for U.S. Appl. No. 09/943,062 dated Sep. 11, 2002; 9 pages.

"PSoC Designer: Integrated Development Environment" User Guide; Revision 1.11; Last Revised Jul. 17, 2001; 109 pages.

Cypress Microsystems, "Cypress Microsystems Unveils Programmable System-on-a-Chip for Embedded Internet, Communications and Consumer Systems;" 2000, <http://www.cypressmicro.com/corporate/ CY__Announces_nov__13__2000.html; 3 pages.

Huang at al., Iceberg, An Embedded In-Circuit Emulator Synthesizer for Microcontrollers, Proceedings of the 36th Design Automation Conference Jun. 21-26,1999; 6 pages.

Yoo et al., "Fast Hardware-Software Co-verification by Optimistic Execution of Real Processor," Proceedings of Design, Automation and Test in Europe Conference and Exhibition 2000; 6 pages.

USPTO Advisory Action for U.S. Appl. No. 09/943,062 dated Mar. 27, 2008; 3 pages.

USPTO Final Rejection for U.S. Appl. No. 09/943,062 dated Jan. 18, 2008; 8 pages.

USPTO Non-Final Rejection for U.S. Appl. No. 09/943,062 dated Jun. 22, 2007; 12 pages.

USPTO Miscellaneous Action for U.S. Appl. No. 09/943,062 dated Jan. 30, 2006; 2 pages.

USPTO Notice of Allowance for U.S. Appl. No. 10/113,064 dated Sep. 21, 2006; 7 pages.

USPTO Non-Final Rejection for U.S. Appl. No. 10/113,064 dated Apr. 6, 2006; 19 pages.

USPTO Final Rejection for Appl. No. 10/113,064 dated Oct. 18, 2005; 22 pages.

USPTO Non-Final Rejection for U.S. Appl. No. 10/113,064 dated Apr. 25, 2005; 15 pages.

USPTO U.S. Appl. No. 10/113,064: "Method and System for Debugging through Supervisory Operating Codes and Self Modifying Codes," Roo et al., filed on Mar. 29, 2002; 36 pages.

USPTO U.S. Appl. No. 10/002,726: "Method and Apparatus for Generating Microcontroller Configuration Information," Ogami et al., filed on Oct. 24, 2001; 54 pages.

USPTO Notice of Allowance for U.S. Appl. No. 10/002,726 dated Feb. 6, 2007; 7 pages.

USPTO Non-Final Rejection for U.S. Appl. No. 10/002,726 dated Aug. 28, 2006; 10 pages.

USPTO Final Rejection for U.S. Appl. No. 10/002,726 dated Mar. 27, 2006; 8 pages.

USPTO Final Rejection for U.S. Appl. No. 10/002,726 dated Nov. 30, 2005; 10 pages.

USPTO Non-Final Rejection for U.S. Appl. No. 10/002,726 dated Jun. 10, 2005; 10 pages.

USPTO Non-Final Rejection for U.S. Appl. No. 10/002,726 dated Dec. 13, 2004; 7 pages.

USPTO U.S. Appl. No. 11/818,005:"Techniques for Generating Microcontroller Configuration Information," Ogami et al, filed on Jun. 12, 2007; 61 pages.

USPTO Requirement for Restriction/Election for U.S. Appl. No. 11/818,005 dated Jul. 14, 2009; 5 pages.

USPTO U.S. Appl. No. 11/850,260: "Circuit and Method for improving the Accuracy of a Crystal-less Oscillator Having Dual-Frequency Modes," Wright et al., filed on Sep. 5, 2007; 33 pages.

USPTO Non-Final Rejection for U.S. Appl. No. 11/850,260 dated Mar. 6, 2009; 7 pages.

USPTO Non-Final Rejection for U.S. Appl. No. 11/644,100 dated Mar. 9, 2009; 11 pages.

USPTO Advisory Action for U.S. Appl. No. 11/644,100 dated Feb. 9, 2009; 3 pages.

USPTO Final Rejection for U.S. Appl. No. 11/644,100 dated Nov. 18, 2008; 12 pages.

USPTO Non-Final Rejection for U.S. Appl. No. 11/644,100 dated Apr. 14, 2008; 10 pages.

USPTO Notice of Allowance for U.S. Appl. No. 11/415,588 dated Mar. 11, 2008; 6 pages.

USPTO Advisory Action for U.S. Appl. No. 11/415,588 dated Jan. 14, 2008; 3 pages.

USPTO Final Rejection for U.S. Appl. No. 11/415,588 dated Oct. 19, 2007; 8 pages.

USPTO Non-Final Rejection for U.S. Appl. No. 11/415,588 dated Jun. 13, 2007; 8 pages.

USPTO Notice of Allowance for U.S. Appl. No. 12/218,404 dated Mar. 19, 2009; 7 pages.

USPTO Non-Final Rejection for U.S. Appl. No. 12/218,404 dated Sep. 30, 2008; 8 pages.

USPTO U.S. Appl. No. 11/644,100: "Differential-to-single ended signal converter circuit and method," Jonathon Stiff, filed on Dec. 21, 2006; 33 pages.

USPTO U.S. Appl. No. 11/415,588: "Voltage Controlled Oscillator Delay Cell and Method," Sivadasan et al., filed on May 1, 2006; 24 pages.

USPTO U.S. Appl. No. 12/218,404: "Voltage Controlled Oscillator Delay Cell and Method," Sivadasan et al., filed on Jul. 14, 2008; 23 pages.

USPTO Notice of Allowance for U.S. Appl. No. 11/132,894 dated Apr. 26, 2007; 4 pages.

USPTO Non-Final Rejection for U.S. Appl. No. 11/132,894 dated Dec. 19, 2006; 12 pages.

USPTO U.S. Appl. No. 11/132,894: "Open Loop Bandwidth Test Architecture and Method for Phase Locked Loop (PLL)," Jonathon Stiff, filed on May 19, 2005; 38 pages.

USPTO Non-Final Rejection for U.S. Appl. No. 11/322,044 dated May 4, 2009; 18 pages.

USPTO Non-Final Rejection for U.S. Appl. No. 11/322,044 dated Nov. 25, 2008; 15 pages.

USPTO Non-Final Rejection for U.S. Appl. No. 11/322,044 dated Apr. 11, 2008; 11 pages.

USPTO Advisory Action for U.S. Appl. No. 11/322,044 dated Nov. 30, 2007; 2 pages.

USPTO Final Rejection for U.S. Appl. No. 11/322,044 dated Sep. 21, 2007; 14 pages.

USPTO Non-Final Rejection for U.S. Appl. No. 11/322,044 dated Apr. 24, 2007; 13 pages.

USPTO U.S. Appl. No. 11/322,044: "Split charge pump Pll architecture," Jonathon Stiff, filed on Dec. 28, 2005; 19 pages.

USPTO Notice of Allowance for U.S. Appl. No. 10/305,589 dated Feb. 4, 2005; 5 pages.

USPTO Final Rejection for U.S. Appl. No. 10/305,589 dated Oct. 21, 2004; 7 pages.

USPTO Non-Final Rejection for U.S. Appl. No. 10/305,589 dated Oct. 7, 2003; 6 pages.
USPTO U.S. Appl. No. 10/305,589: "Current Controlled Delay Circuit," Jonathon Stiff, filed on Nov. 26, 2002; 18 pages.
USPTO U.S. Appl. No. 09/849,164: "Reduced Static Phase Error CMOS PLL Charge Pump," Jonathon Stiff, filed on May 4, 2001; 30 pages.
Maneatis, "Low-Jitter Process-Independent DLL and PLL Based on Self-Biased Techniques," IEEE Journal of Solid-State Circuits, vol. 31, No. 11, Nov. 1996; 10 pages.
Larsson, "A Feb. 1600-MHz CMOS Clock Recovery PLL with Low-V dd Capability," IEEE Journal of Solid-State Circuits, vol. 34, No. 12, Dec. 1999; 10 pages.
USPTO Notice of Allowance for U.S. Appl. No. 10/327,217) dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
USPTO U.S. Appl. No. 10/327,217; "Single Ended Clock Signal Generator Having a Differential Output," Richmond et al., filed on Dec. 20, 2002; 27 pages.
USPTO Notice of Allowance for U.S. Appl. No. 10/871,582 dated Mar. 30, 2006; 6 pages.
USPTO Final Rejection for U.S. Appl. No. 10/871,582 dated Feb. 1, 2006; 5 pages.
USPTO Non-Final Rejection for U.S. Appl. No. 10/871,582 dated Sep. 7, 2005; 7 pages.
USPTO U.S. Appl. No. 10/871,582; "LVDS Input Circuit with Extended Common Mode Range," Reinschmidt at al., filed on Jun. 17, 2004; 25 pages.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
USPTO U.S. Appl. No. 09/404,891: "Method, Architecture and Circuitry for Controlling Pulse Width in a Phase and/or Frequency Detector," Scott et al., filed on Sep. 24, 1999; 17 pages.
USPTO Notice of Allowance for U.S. Appl. No. 10/226,911 dated Aug. 20, 2004; 4 pages.
USPTO Non-Final Rejection for U.S. Appl. No. 10/226,911 dated Mar. 19, 2004; 6 pages.
USPTO U.S. Appl. No. 10/226,911: "Calibration of integrated Circuit Time Constants," Gehring et al.; filed on Aug. 22, 2002; 32 pages.
USPTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No.. 09/943,149 dated May 7, 2003; 10 pages.
USPTO Non-Final Rejection for U.S. Appl. No. 09/943,149 dated Nov. 20, 2002; 7 pages.
USPTO U.S. Appl. No. 09/943,149: "Method for Phase Locking in a Phase Lock Loop," Moyal et al., filed on Aug. 30, 2001; 21 pages.
Durham et al., "Integrated Continuous-Time Balanced Filters for 16-bit DSP Interfaces," IEEE, 1993; 6 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLS! CMOS," IEEE, 1992; 8 pages.
USPTO U.S. Appl. No. 09/047,595: "Roving Range Control to Limit Receive Pll Frequency of Operation," Paul H. Scott, filed on Mar. 29, 1998; 35 pages.

USPTO U.S. Appl. No. 09/216,460: "Circuit and Method for Controlling an Output of a Ring Oscillator," Abugharbieh et al., filed on Dec. 18, 1998; 21 pages.
USPTO U.S. Appl. No. 09/471,914: "Reference-Free Clock Generator and Data Recovery PLL," Dalmia et al., filed on Dec. 23, 1999; 32 pages.
USPTO U.S. Appl. No. 09/471,576: "Reference-Free Clock Generation and Data Recovery PLL," Kamal Dalmia, filed on Dec. 23, 1999; 30 pages.
USPTO U.S. Appl. No. 10/083,442: "Method/Architecture for a Low Gain PLL with Wide Frequency Range," Meyers at al., filed on Feb. 26, 2002; 28 pages.
USPTO U.S. Appl. No. 09/470,665: "Digital Phase/Frequency Detector, and Clock Generator and Data Recovery PLL Containing the Same," Kamal Dalmia, filed on Dec. 23, 1999; 26 pages.
USPTO U.S. Appl. No.. 09/893,161: "Architecture of a PLL with Dynamic Frequency Control on a PLD," Michael T. Moore, filed on Jun. 27, 2001; 32 pages.
USPTO U.S. Appl. No. 09/608,753: "Pll Lockout Watchdog," Wilson et al., filed on Aug. 24, 2004; 24 pages.
USPTO U.S. Appl. No. 09/398,956: "Frequency Acquisition Rate Control in Phase Lock Loop Circuits," Moyal et al., filed on Sep. 17, 1999; 35 pages.
USPTO U.S. Appl. No. 09/747,262: "Linearized Digital Phase-Locked Loop," Williams at al., filed on Dec. 22, 2000; 9 pages.
USPTO U.S. Appl. No. 09/981,448: "Oscillator Tuning Method," Lane T. Hauck, filed on Oct. 17, 2001; 28 pages.
USPTO U.S. Appl. No. 09/538,989: "Memory Based Phase Locked Loop," Rengarajan S. Krishnan, filed on Mar. 30, 2000; 27 pages.
USPTO U.S. Appl. No. 09/048,905: "Programmable Clock Generator," Mann et al., filed on Mar. 26, 1998; 42 pages.
USPTO U.S. Appl. No. 08/865,342: "Programmable Clock Generator," Mann et al., filed on May 29, 1997; 41 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
USPTO U.S. Appl. No. 10/293,392: "Low Voltage Receiver Circuit and Method for Shifting the Differential Input Signals of the Receiver Depending on a Common Mode Voltage of the Input Signals," Maher et al., filed on Nov. 13, 2002; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004; 6 pages.
USPTO Non-Final Rejection for U.S. Appl. No. 10/288,003 dated Apr. 7, 2004; 9 pages.
USPTO U.S. Appl. No. 10/288,003: "Low Voltage Differential Signal Driver Circuit and Method," Roper et al., filed on Nov. 4, 2002; 30 pages.
USPTO Notice of Allowance for U.S. Appl. No. 09/989,777 dated Mar. 9, 2009; 7 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
USPTO U.S. Appl. No. 11/200,619: "Providing hardware independence to automate code generation of processing device firmware," Snyder et al., filed on Aug. 10, 2005; 41 pages.
USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for U.S. Appl. No. 11/201,922 dated Apr. 30, 2008; 10 pages.
USPTO Non-Final Rejection for U.S. Appl. No. 11/201,922 dated Oct. 15, 2007; 10 pages.
USPTO U.S. Appl. No. 11/201,922: "Design model for a hardware device-independent method of defining embedded firmware for programmable systems," McDonald et al., filed on Aug. 10, 2005; 31 pages.

USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
USPTO U.S. Appl. No. 11/201,627: "Method and an apparatus to design a processing system using a graphical user interface," Ogami et al., filed on Aug. 10, 2005; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
USPTO U.S. Appl. 09/989,808: "Automatic generation of application program interfaces, source code, interrupts, and data sheets for microcontroller programming," Bath et al filed on Nov. 19, 2001; 67 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
USPTO U.S. Appl. No. 10/109,979: "Graphical user interface with logic unifying functions," Anderson et al., filed on Mar. 29, 2002; 100 pages.
USPTO U.S. Appl. 091989,781: "System and method for decoupling and iterating resources associated with a module," Ogami et al., filed an Nov. 19, 2001; 40 pages.
USPTO U.S. Appl. No. 09/989,775: "User defined names for registers in memory banks derived from. configurations," Ogami et al., filed on Nov. 19, 2001; 29 pages.
USPTO Notice of Allowance for U.S. Appl. No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
USPTO U.S. Appl. No. 091989,819: "System and method for creating a boot file utilizing a boot template," Ogami et al., filed on Nov. 19, 2001; 43 pages.
USPTO Notice of Allowance for U.S. Appl. No. 09/989,761 dated Jan. 14, 2005; 6 pages.
USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 091989,761 dated Apr. 18, 2003; 5 pages.
USPTO U.S. Appl. No. 09/989,761; "Storing of global parameter defaults and using them over two or more design projects," Ogami et al., filed on Nov. 19, 2001; 37 pages.
Wang, et al. "Synthesizing Operating System Based Device Drivers in Embedded Systems," Oct. 1-3, 2003; ACM; 8 pages.
Lutovac et al. "Symbolic Computation of Digital Filter Transfer Function Using Matlab," Proceedings of 23rd International Conference on Microelectronics (MIEL 2002), vol. 2 NIS, Yugoslavia; 4 pages.
Nouta at at "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Xilinx, Virtex-II Pro Platform FPGA Developer's Kit, "How Data2BRAM Fits in with Hardware and Software Flows," Chapter 2: Using Data2BRAM; Jan. 2003 Release; 2 pages.
PCT Preliminary Report on Patentability (Chapter 1 of the Patent Cooperation Treaty), PCT/US2005/028793, filed Aug. 12, 2005, mailed Dec. 21, 2007; 2 pages.
PCT Written Opinion of the International Searching Authority for PCT/US2005/028793, filed Aug. 12, 2005, mailed Nov. 19, 2007; 7 pages.

PCT International Search Report of the International Searching Authority for PCT/US05/28793, filed Aug. 12, 2005, mailed Nov. 19, 2007; 5 pages.
International Search Report and Written Opinion of the International Searching Authority for PCT/US05/28898, filed Aug. 12, 2005, mailed Mar. 6, 2007; 6 pages.
Burogs et al., "Power Converter Analysis and Design using Matlab: A Transfer Function Approach," Proceedings of IEEE International Symposium on Industrial Electronics 1998, vol. 2; 6 pages.
Efstathiou, "Analog Electronics: Basic Circuits of Operational Amplifiers," <http://web.archive.org/ web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.
Kory Hopkins, "Definition;" Jan. 16, 1997; <http://www.cs.sfu.ca/cs/peopie/GradStudent.html>: 1 page.
Ebeling et al., "Validating VLSI Circuit Layout by Wirelist Comparison;" Sep. 1983; in proceedings of the IEEE International Conference on Computer Aided Design (ICCAD-83); 2 pages.
"The Gemini Netlist Comparison Project;" <http://www.cs.washington.edu/research/projects/lis/www/gemini/gemini. html> larry@cs.washington.edu; Mar. 19, 2002; 2 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Ebling, "Gemini Ii: A Second Generation Layout Validation Program;" 1988; in proceedings of the IEEE International Conference on Computer Aided Design (Iccad-88); 4 pages.
USPTO U.S. Appl. No. 12/132,527: "System and Method for Performing Next Placements and Pruning of Disallowed Placements for Programming an Integrated Circuit;" Ogami et al., filed on Jun. 3, 2008; 44 pages.
USPTO U.S. Appl. No. 12/356,468: "System and Method for Dynamically Generating a Configuration Datasheet," Anderson et al.; filed on Jan. 20, 2009; 27 pages.
Written Opinion of the International Search Authority for International Application No. PCT/US08/60680 dated Aug. 15, 2008; 4 pages.
USPTO Notice of Allowance for U.S. Appl. No. 09/475,879 dated Oct. 22, 2004; 7 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
USPTO U.S. Appl. No. 09/475,879 : "Programmable Logic Device," Lacey et ai.; filed on Dec. 30, 1999; 50 pages.
USPTO U.S. Appl. No. 09/475,808: "Configurable Memory for Programmable Logic Circuits," Lacey et al., filed on Dec. 30, 1999; 24 pages.
USPTO Non-Final Rejection for U.S. Appl. No. 09/475,808 dated Jun. 6, 2001; 8 pages.
USPTO Notice of Allowance for U.S. Appl. No. 09/475,808 dated Nov. 6, 2001; 8 pages.
USPTO U.S. Appl. No. 10/137,497: "Reconfigurable Testing System and Method," Pleis et al.; filed on May 1, 2002; 40 pages.
USPTO Non-Final Rejection for U.S. Appl. No. 10/137,497 dated Nov. 5, 2004; 17 pages.
USPTO Final Rejection for U.S. Appl. No. 10/137,497 dated May 5, 2005; 13 pages.
USPTO Non-Final Rejection for U.S. Appl. No. 10/137,497 dated Sep. 22, 2005; 21 pages.
USPTO Final Rejection for U.S. Appl. No. 10/137,497 dated Mar. 13, 2006; 15 pages.
USPTO Non-Final Rejection for U.S. Appl. No. 10/137,497 dated Aug. 2, 2006; 21 pages.
USPTO Notice of Allowance for U.S. Appl. No. 10/137,497 dated Jan. 24, 2007; 12 pages.

USPTO Notice of Allowance for U.S. Appl. No. 10/137,497 dated Jul. 20, 2007; 4 pages.
USPTO U.S. Appl. No. 10/653,050: "Method and System for Programming a Memory Device," Snyder et al.; filed on Aug. 29, 2003; 69 pages.
USPTO Non-Final Rejection for U.S. Appl. No. 10/653,050 dated Apr. 6, 2004; 7 pages.
USPTO Notice of Allowance for U.S. Appl. No. 10/653,050 dated Jul. 29, 2004; 3 pages.
USPTO U.S. Appl. No. 10/172,670: "Method and System for Programming a Memory Device," Snyder at al.; filed on Jun. 13, 2002; 66 pages.
USPTO U.S. Appl. No. 11/986,338 : Reconfigurable Testing System and Method, Pieis et al., filed on Nov. 20, 2007; 41 pages.
USPTO Notice of Allowance for U.S. Appl. No. 11/965,291 dated May 5, 2009; 7 pages.
USPTO Non-Final Rejection for U.S. Appl. No. 11/965,291 dated Dec. 17, 2008; 8 pages.
USPTO U.S. Appl. No. 11/965,291: "Universal Digital Block Interconnection and Channel Routing," Snyder et al., filed on Dec. 27, 2007; 31 pages.
USPTO Notice of Allowance for U.S. Appl. No. 11/986,338 dated May 7, 2009; 1 page.
USPTO U.S. Appl. No. 11/273,708: "Capacitance Sensor Using Relaxation Oscillators," Snyder of al., filed on Nov. 14, 2005; 33 pages.
USPTO Non-Final Rejection for U.S. Appl. No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/273,708 dated Aug. 9, 2007; 4 pages.
USPTO U.S. Appl. No. 11/337,272: "Successive Approximate Capacitance Measurement Circuit;" Warren Snyder, filed on Jan. 20, 2006 29 pages.
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 11/337,272 dated Feb. 2, 2007; 11 pages.
USPTO Advisory Action for U.S. Appl. No. 11/337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.
USPTO U.S. Appl. No. 11/983,291: "Successive Approximate Capacitance Measurement Circuit," Warren Snyder, filed on Nov. 7, 2007; 26 pages.
USPTO Non-Final Rejection for U.S. Appl. No. 11/983,291 dated Mar. 9, 2009; 9 pages.
USPTO U.S. Appl. No. 11/698,660: "Configurable Bus," Kutz et al., filed on Jan. 25, 2007; 35 pages.
USPTO Non-Final Rejection for U.S. Appl. No. 11/698,660 dated Dec. 2, 2008; 12 pages.
USPTO Final Rejection for U.S. Appl. No. 11/698,660 dated May 28, 2009; 12 pages.
USPTO U.S. Appl. No. 11/709,866: "input/Output Multiplexer Bus," Dennis Sequine, filed on Feb. 21, 2007; 33 pages.
USPTO Non-Final Rejection for U.S. Appl. No. 11/709,866 dated Nov. 7, 2008; 14 pages.
USPTO Notice of Allowance for U.S. Appl. No. 11/709,866 dated Apr. 7, 2009; 8 pages.
Sedra et al., "Microelectronic Circuits," 3rd Edition, 1991, Oxford University Press, Feb. 5, 2007; 20 pages.
Van Ess, David; "Simulating a 555 Timer with PSoC," Cypress Semiconductor Corporation, Application Note AN2286, May 19, 2005; 10 pages.
Cypress Semiconductor Corporation, "Fan Controller CG6457AM and CG6462AM," PSoC Mixed Signal Array Preliminary Data Sheet; May 24, 2005; 25 pages.
Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "CY8C21x34 Data Sheet," CSR User Module, CSR V.1.0; Oct. 6, 2005; 36 pages.
Chapweske, Adam; "The PS/2 Mouse Interface," PS/2 Mouse interfacing, 2001, retrieved on May 18, 2006; 11 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan., 24, 2007; 3 pages.
Cypress Semiconductor Corporation, "PSoC CY8C20x34 Technical Reference Manual (TRM)," PSoC CY8C20x34 TRM, Version 1.0, 2006; 220 pages.
USPTO U.S. Appl. No. 11/166,622: "Touch wake for electronic devices," Beard et al., filed on Jun. 23, 2005; 22 pages.
International Written Opinion of the International Searching Authority for International Application No. PCT/US2006/09572 dated Jan. 10, 2008; 5 pages.
International Search Report for International Application No. PCT/US2006/09572 dated Jan. 10, 2008; 2 pages.
USPTO Notice of Allowance for U.S. Appl. No. 10/024,093 dated Sep. 10, 2002; 7 pages.
USPTO U.S. Appl. No. 10/024,093: "Configurable Memory for Programmable Logic Circuits," Lacey et al., filed on Dec. 18, 2001; 25 pages.
USPTO U.S.Appl. No. 11/088,028: "Method and Circuit for Rapid Alignment of Signals," Moyal et al., filed on Nov. 13, 2007; 34 pages.
USPTO Notice of Allowance for U.S.Appl. No. 11/088,028 dated Jul. 2, 2007; 6 pages.
USPTO Notice of Allowance for U.S.Appl. No. 11/088,028 dated Jan. 26, 2007; 6 pages.
USPTO Non-Final Rejection for U.S.Appl. No. 11/088,028 dated Jun. 16, 2006; 8 pages.
USPTO U.S.Appl. No. 11/985,340: "Method and Circuit for Rapid Alignment of Signals," Moyal et al., filed on Nov. 13, 2007; 34 pages.
USPTO Notice of Allowance for U.S.Appl. No. 11/985,340 dated Jun. 2, 2009; 7 pages.
USPTO Requirement for Restriction for U.S.Appl. No. 11/985,340 dated Mar. 16, 2009; 7 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967240 dated Jun. 10, 2009; 7 pages.
USPTO Non-Final Rejection for U.S. Appl. No. 11/857,947 dated Mar. 30, 2009; 18 pages.
USPTO Non-Final Rejection for U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International Application No. PCT/US08/60695 dated Jul. 22, 2009; 3 pages.
Written Opinion of the International Searching Authority for International Application No. PCT/US08/60695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7.1-8.7.5; 6 pages.

Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
International Search Report of the International Searching Authority for International Application No. PCT/US08/60696 dated Sep. 22, 2008; 2 pages.
International Search Report of the International Searching Authority for International Application No. PCT/US08/60698 dated Sep. 5, 2008; 2 pages.
Shahbahrami et al., "Matrix Register File and Extended Subwords: Two Techniques for Embedded Media Processors," ACM, May 2005; 9 pages.
Jung et al,, "A Register File with Transposed Access Mode," 2000, IEEE; 2 pages.
International Search Report of the International Searching Authority for International Application No. PCT/US08/60681 dated Sep. 12, 2008; 2 pages.
Written Opinion of the international Searching Authority for International Application No. PCT/US08160681 dated Sep. 12, 2008; 4 pages.
USPTO Notice of Allowance for U.S. Appl. No. 11/965,6T7 dated Sep. 10, 2009; 6 pages.
USPTO Non-Final Rejection for U.S. Appl. No. 11/965,677 dated Mar. 10, 2009; 10 pages.
Written Opinion of the International Searching Authority for international Application No. PCT/US08/60696 dated Sep. 22, 2008; 4 pages.
USPTO Notice of Allowance for U.S. Appl. No. 10/238,966 dated Aug. 5, 2009; 5 pages.
USPTO Notice of Allowance for U.S. Appl. No. 10/033,027 dated Sep. 2, 2009; 4 pages.
USPTO Non-Final Rejection for U.S. Appl. No. 10/001,478 dated Aug. 4, 2009; 17 pages.
USPTO Advisory Action for U.S. Appl. No. 10/001,478 dated Jun. 30, 2009; 3 pages.
USPTO Final Rejection for U.S. Appl. No. 10/001,478 dated Apr. 20, 2009; 16 pages.
USPTO Notice of Allowance for U.S. Appl. No. 10/002,217 dated Sep. 17, 2009; 6 pages.
USPTO Notice of Allowance for U.S. Appl. No. 10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages.
USPTO Ex Parte Quayle Action for U.S. Appl. No. 09/975,115 dated Aug. 20, 2009; 7 pages.
USPTO Non-Final Rejection for U.S. Appl. No. 09/994,601 dated Jul. 9, 2009; 11 pages.
USPTO Non-Final Rejection for U.S. Appl. No. 11/818,005 dated Nov. 23, 2009; 8 pages.
USPTO Requirement for Restriction/Election for U.S. Appl. No. 11/818,005 dated Jul. 14, 2009; 5 pages.
USPTO Advisory Action for U.S. Appl. No. 09/989,778 dated Jun. 17, 2009; 3 pages.
USPTO Notice of Allowance for U.S. Appl. No. 09/994,600 dated Aug. 25, 2009; 4 pages.
USPTO Notice of Allowance for U.S. Appl. No. 09/994,600 dated Apr. 3, 2009; 5 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 091998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009; 4 pages.
USPTO Notice of Allowance for U.S. Appl. No. 09/989,777 dated Aug. 6, 2009; 8 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Final Rejection for U.S. Appl. No. 09/989,767 dated Dec. 7, 2009; 22 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.

USPTO Non-Final Rejection for U.S. Appl. No. 11/644,100 dated Dec. 16, 2009; 13 pages.
USPTO Non-Final Rejection for U.S. Appl. No. 11/644,100 dated Dec. 16, 2009; 13 pages.
USPTO Non-Final Rejection for U.S. Appl. No. 10/113,581 dated .Feb. 24, 2006; 11 pages.
USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/113,581 dated Aug. 12, 2005; 12 pages.
USPTO Notice of Allowance for U.S. Appl. No. 10/113,581 dated Mar. 5, 2010; 9 pages.
USPTO Non-Final Rejection for U.S. Appl. No. 10/113,581 dated Sep. 1, 2009; 18 pages.
USPTO Final Rejection for U.S. Appl. No. 10/113,581 dated May 11, 2009; 21 pages.
USPTO Non-Final Rejection for U.S. Appl. No. 10/113,581 dated Nov. 26, 2008; 20 pages.
USPTO Final Rejection for U.S. Appl. No. 10/113,581 dated Jun. 11, 2008; 14 pages.
USPTO Non-Final Rejection for U.S. Appl. No. 10/113,581 dated Nov. 27, 2007; 15 pages.
USPTO Final Rejection for U.S. Appl. No. 10/113,581 dated Jul. 13, 2007; 15 pages.
USPTO Non-Final Rejection for U.S. Appl. No. 10/113,581 dated Jan. 10, 2007; 14 pages.
USPTO Final Rejection for U.S. Appl. No. 10/113,581 dated Aug. 10, 2006; 13 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.
USPTO Non-Final Rejection for U.S. Appl. No. 11/799,439 dated Nov. 2, 2007; 7 pages.
USPTO Non-Final Rejection for U.S. Appl. No. 11/799,439 dated May 29, 2008; 8 pages.
USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.
USPTO Notice of Allowance for U.S. Appl. No. 11/799,439 dated Feb. 5, 2010; 4 pages.
USPTO Notice of Allowance for U.S. Appl. No. 11/347,189 dated Sep. 27, 2007; 4 pages.
USPTO Non-Final Rejection for U.S. Appl. No. 11/347,189 dated Jun. 8, 2007; 6 pages.
USPTO Notice of Allowance for U.S. Appl. No. 12/070,547 dated Feb. 24, 2010; 4 pages.
USPTO Final Rejection for U.S. Appl. No. 12/070,547 dated Oct. 30, 2009; 5 pages.
USPTO Non-Final Rejection for U.S. Appl. No. 12/070,547 dated Jun. 3, 2009; 6 pages.
USPTO Non-Final Rejection for U.S. Appl. No. 11/201,922 dated Jun. 11, 2010; 12 pages.
USPTO Notice of Allowance for U.S. Appl. No. 09/943,062 dated Jun. 29, 2010; 4 pages.
USPTO Final Rejection for U.S. Appl. No. 11/818,005 dated May 24, 2010; 8 pages.
USPTO Non-Final Rejection for U.S. Appl. No. 12/132,527 dated Apr. 29, 2010; 7 pages.
USPTO Notice of Allowance for U.S. Appl. No. 10/256,829 dated May 10, 2010; 4 pages.
USPTO Non-Final Rejection for U.S. Appl. No. 101256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jan. 7, 2009; 7 pages.
USPTO Non-Final Rejection for U.S. Appl. No. 10/256,829 dated Jun. 26, 2008; 11 pages.
USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 101256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for Application No. 09/989,817 dated Jan. 12, 2005; 5 pages.
USPTO Non-Final Rejection for U.S. Appl. No. 09/989,817 dated Jun. 8, 2004 ; 7 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.
USPTO Final Rejection for U.S. Appl. No. 10/327,207 dated Mar. 2, 2006; 13 pages.
USPTO Non-Final Rejection for U.S. Appl. No. 10/327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.
USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.
USPTO Final Rejection for U.S. Appl. No. 09/989,570 dated May 30, 2003; 9 pages.
USPTO Non-Final Rejection for U.S. Appl. No. 09/989,570 dated Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. Moons Mahe, "Computer System Architecture," 1982, Prentice-Hall, 2nd Edition, pp. 261-264 and 435-440; 14 pages.

Dirk Killat, "A One-Chip Solution for Electronic Ballasts in Fluorescent Lamps," Power Electronics, <http://powerelectronics.com/mag/power_onechip_solution_electronic/>, dated Mar. 1, 2004, accessed Sep. 13, 2005; 4 pages.

Fred Eady, "PSoC 101," Circuit Cellar, Aug. 2004, accessed Sep. 13, 2005, <http://www.circuitcellar.com/library/print/0804/eady169/2.htm>; 4 pages.

USPTO Notice of Allowance for U.S. Appl. No. 10/803,030 dated Jan. 8, 2007; 6 pages.

USPTO Non-Final Rejection for U.S. Appl. No. 10/803,030 dated Jun. 8, 2005; 4 pages.

U.S. Appl. No. 12/058,586: "System and Method for Monitoring a Target Device," Ogami et al., filed on Mar. 28, 2008; 41 pages.

U.S. Appl. No. 12/058,534: "System and Method for Controlling a Target Device," Ogami et al., filed on Mar. 28, 2008; 40 pages.

U.S. Appl. No. 12/004,833: "Systems and Methods for Dynamically Reconfiguring a Programmable System on a Chip," Ogami et al., filed on Dec. 21, 2007; 40 pages.

U.S. Appl. No. 12/058,569: "Configuration of Programmable Ic Design Elements," Best et al., filed on Mar. 28, 2008; 19 pages.

U.S. Appl. No. 12/057,149: "Power Management Architecture, Method and Configuration System," Kenneth Ogami, filed on Mar. 27, 2008; 34 pages.

U.S. Appl. No. 12/765,400: "Autonomous Control in a Programmable System," Sullam et al., filed on Apr. 22, 2010; 30 pages.

International Search Report for International Application No. PCT/US10/33626 mailed Jun. 24, 2010; 3 pages.

The Written Opinion of the International Search Report for International Application No. PCT/US10/33626 mailed Jun. 24, 2010; 5 pages.

USPTO Non-Final Rejection for U.S. Appl. No. 12/060,176 dated Mar. 30, 2010; 22 pages.

John Mangino, "Using DMA with High Performance Peripherals to Maximize System Performance," 2007, Texas instruments, pp. 1-23; 23 pages.

Balough et al., "White Paper: Comparing IP Integration Approaches for FPGA Implementation," Feb. 2007, Version 1,1, Altera, pp. 1-7; 7 pages.

A.F. Harvey, "DMA Fundamentals on Various PC Platforms," 2001, 2004, National Instruments Corporation, pp. 1-19; 19 pages.

Vixel, "InSpeed SOC 320 Embedded Storage Switch," 2003, Vixel, pp. 1-5; 5 pages.

USPTO Non-Final Rejection for U.S. Appl. No. 121058,569 dated Aug. 2, 2010; 9 pages.

USPTO Miscellaneous Action for U.S. Appl. No. 10/113,581 dated Jun. 23, 2010; 6 pages.

USPTO Miscellaneous Action for U.S. Appl. No. 101001,478 dated Feb. 23, 2010; 5 pages.

USPTO Notice of Allowance for U.S. Appl. No. 10/001,478 dated Jun. 2, 2010; 11 pages.

USPTO Notice of Allowance for U.S. Appl. No. 11/985,340 dated Jun. 9, 2010; 8 pages.

USPTO Notice of Allowance for U.S. Appl. No. 11/850,260 dated Jul. 2, 2010; 8 pages.

USPTO Notice of Allowance for U.S. Appl. No. 12/060,128 dated Oct. 19, 2009; 8 pages.

USPTO Non-Final Rejection for U.S. Appl. No. 09/975,338 dated Apr. 30, 2010; 2 pages.

USPTO Advisory Action for U.S. Appl. No. 11/818,005 dated Jul. 30, 2010; 3 pages.

USPTO Non-Final Rejection for U.S. Appl. No. 12/132,527 dated Apr. 29, 2010; 7 pages.

USPTO Advisory Action for U.S. Appl. No. 11/201,627 dated Aug. 5, 2010; 3 pages.

USPTO Final Rejection for U.S. Appl. No. 11/201,627 dated May 24, 2010; 26 pages.

USPTO Non-Final Rejection for U.S. Appl. No. 11/166,622 dated Jun. 22, 2010; 11 pages.

USPTO Final Rejection for U.S. Appl. No. 11/166,622 dated Mar. 18, 2010; 12 pages.

USPTO Non-Final Rejection for U.S. Appl. No. 11/698,660 dated May 21, 2010; 15 pages.

USPTO Advisory Action for U.S. Appl. No. 11/644,100 dated Jul. 21, 2010; 3 pages.

USPTO Final Rejection for U.S. Appl. No. 11/644,100 dated May 19, 2010; 13 pages.

USPTO Final Rejection for U.S. Appl. No. 11/865,672 dated Dec. 30, 2009; 6 pages.

USPTO Final Rejection for U.S. Appl. No. 11/857,947 dated Oct. 14, 2009; 22 pages.

USPTO Non-Final Rejection for U.S. Appl. No. 11/857,947 dated Feb. 3, 2010; 23 pages.

USPTO Non-Final Rejection for U.S. Appl. No. 11/857,947 dated Jul. 21, 2010; 15 pages.

USPTO Non-Final Rejection for U.S. Appl. No. 11/968,145 dated Mar. 4, 2010; 11 pages.

USPTO Final Rejection for U.S. Appl. No. 11/9681145 dated Aug. 2, 2010; 6 pages.

USPTO Non-Final Rejection for U.S. Appl. No. 12/104,678 dated Jul. 2, 2010; 8 pages.

USPTO Advisory Action for U.S. Appl. No. 11/779,439 dated Mar. 30, 2009; 3 pages.

USPTO Notice of Allowance for U.S. Appl. No. 10/001,478 dated Sep. 7, 2010; 10 pages.

USPTO Notice of Allowance for U.S. Appl. No. 11/818,005 dated Oct. 26, 2010; 10 pages.

USPTO Final Rejection for U.S. Appl. No. 12/132,527 dated Oct. 14, 2010; 8 pages.

USPTO Non-Final Rejection for U.S. Appl. No. 11/201,627 dated Sep. 30, 2010; 6 pages.

USPTO Final Rejection for U.S. Appl. No. 11/698,660 dated Sep. 3, 2010; 19 pages.

USPTO Advisory Action for U.S. Appl. No. 11/698,660 dated Nov. 10, 2010; 3 pages.

USPTO Non-Final Rejection for U.S. Appl. No. 11/644,100 dated Sep. 15, 2010; 10 pages.

USPTO Non-Final Rejection for U.S. Appl. No. 11/201,922 dated Jun. 11, 2010; 12 pages.

USPTO Final Rejection for U.S. Appl. No. 12/060,176 dated Oct. 12, 2010; 22 pages.

USPTO Advisory Action for U.S. Appl. No. 12/136,577 dated Oct. 29, 2010; 3 pages.

USPTO Non-Final Rejection for U.S. Appl. No. 11/644,100 dated Dec. 16, 2009; 13 pages.

USPTO Final Rejection for U.S. Appl. No. 11/166,622 dated Mar. 18, 2010; 12 pages.

USPTO Non-Final Rejection for U.S. Appl. No. 11/698,660 dated Dec. 13, 2010; 20 pages.

USPTO Notice of Allowance for U.S. Appl. No. 11/644,100 dated Jan. 6, 2011; 6 pages.

USPTO Non-Final Rejection for U.S. Appl. No. 11/201,922 dated Dec. 28, 2010; 14 pages.

USPTO Final Rejection for U.S. Appl. No. 11/166,622 dated Dec. 7, 2010; 12 pages.

USPTO Non-Final Rejection for U.S. Appl. No. 11/166,622 dated Jun. 22, 2010; 11 pages.

USPTO Final Rejection for U.S. Appl. No. 09/989,771 dated Jan. 4, 2011; 12 pages.

USPTO Non-Final Rejection for U.S. Appl. No. 09/975,338 dated Apr. 30, 2010; 10 pages.

USPTO Non-Final Rejection for U.S. Appl. No. 11/818,005 dated Oct. 26, 2010; 10 pages.

USPTO Final Rejection for U.S. Appl. No. 12/132527 dated Oct. 14, 2010; 8 pages.

USPTO Non-Final Rejection for U.S. Appl. No. 12/004,833 dated Dec. 21, 2010; 8 pages.

USPTO Notice of Allowance for U.S. Appl. No. 12/058,569 dated Dec. 13, 2010; 6 pages.

USPTO Non-Final Rejection for U.S. Appl. No. 09/989,782 dated Oct. 27, 2009; 9 pages.

USPTO Final Rejection for U.S. Appl. No. 12/104,678 dated Dec. 3, 2010; 9 pages.

USPTO Final Rejection for U.S. Appl. No. 11/857,947 dated Jan. 4, 2011; 14 pages.

USPTO Non-Final Rejection for U.S. Appl. No. 11/968,145 dated Jan. 5, 2011; 8 pages.
USPTO Advisory Action for U.S. Appl. No. 09/994,601 dated Mar. 23, 2010; 2 pages.
USPTO Notice of Allowance for U.S. Appl. No. 12/057,149 dated Nov. 30, 2010; 7 pages.
USPTO Final Rejection for U.S. Appl. No. 12/060,176 dated Oct. 12, 2010; 22 pages.
USPTO Notice of Allowance for U.S. Appl. No. 09/998,848 dated Oct. 13, 2010; 4 pages.
USPTO Non-Final Rejection for U.S. Appl. No. 09/998,848 dated Jun. 21, 2010; 15 pages.
USPTO Advisory Action for U.S. Appl. No. 09/998,848 dated Feb. 24, 2010; 3 pages.
USPTO Non-Final Rejection for U.S. Appl. No. 09/989,767 dated Jul. 9, 2010; 22 pages.
USPTO Non-Final Rejection for U.S. Appl. No. 09/989,771 dated Jul. 20, 2010; 12 pages.
USPTO Advisory Action for U.S. Appl. No. 09/989,771 dated Feb. 3, 2010; 3 pages.
USPTO Miscellaneous Action for U.S. Appl. No. 10/113,581 dated Jun. 23, 2010; 6 pages.
USPTO Notice of Allowance for U.S. Appl. No. 10/113,581 dated Sep. 3, 2010; 11 pages.
USPTO Non-Final Rejection for U.S. Appl. No. 12/058,534 dated Jan. 11, 2011; 17 pages.
USPTO Non-Final Rejection for U.S. Appl. No. 12/004,833 dated Dec. 21, 2010; 8 pages.
USPTO Requirement Restriction for U.S. Appl. No. 12/004,833 dated Sep. 22, 2010; 6 pages.
U.S. Appl. No. 12/058,586; "System and Method for Monitoring a Target Device," Kenneth Ogami et al. filed on Mar. 28, 2008; 56 pages.
USPTO Notice of Allowance for U.S. Appl. No. 10/118,682 dated Apr. 3, 2006; 4 pages.
USPTO Final Rejection for U.S. Appl. No. 10/118,682 dated Oct. 12, 2005; 11 pages.
USPTO Non-Final Rejection for U.S. Appl. No. 10/118,682 dated Jun. 16, 2005; 12 pages.
USPTO Requirement Restriction for U.S. Appl. No. 10/118,682 dated Apr. 28, 2005; 4 pages.
USPTO Non-Final Rejection for U.S. Appl. No. 10/118,682 dated Jan. 12, 2005; 11 pages.
USPTO Non-Final Rejection for U.S. Appl. No. 10/118,682 dated Sep. 24, 2004; 8 pages.
USPTO Final Rejection for U.S. Appl. No. 10/118,682 dated May 3, 2004; 8 pages.
USPTO Non-Final Rejection for U.S. Appl. No. 10/118,682 dated Feb. 25, 2004; 9 pages.
USPTO Non-Final Rejection for U.S. Appl. No. 10/118,682 dated Nov. 3, 2003; 8 pages.
USPTO Notice of Allowance for U.S. Appl. No. 10/329,162 dated Jul. 5, 2007; 7 pages.
USPTO Non-Final Rejection for U.S. Appl. No. 10/329,162 dated Jan. 29, 2007; 10 pages.
USPTO Final Rejection for U.S. Appl. No. 10/329,162 dated Aug. 25, 2006; 12 pages.
USPTO Non-Final Rejection for U.S. Appl. No. 10/329,162 dated Mar. 10, 2006; 9 pages.
USPTO Final Rejection for U.S. Appl. No. 10/329,162 dated Sep. 21, 2005; 12 pages.
USPTO Non-Final Rejection for U.S. Appl. No. 10/329,162 dated Apr. 21, 2005; 10 pages.
USPTO Advisory Action for U.S. Appl. No. 10/329,162 dated Mar. 29, 2005; 2 pages.
USPTO Final Rejection for U.S. Appl. No. 10/329,162 dated Dec. 15, 2004; 10 pages.
USPTO Non-Final Rejection for U.S. Appl. No. 10/329,162 dated Aug. 2, 2004; 8 pages.
USPTO Notice of Allowance for U.S. Appl. No. 091975,115 dated May 9, 2011; 11 pages.
USPTO Non-Final Rejection for U.S. Appl. No. 10/033,027 dated Mar. 15, 2011; 6 pages.
USPTO Notice of Allowance for U.S. Appl. No. 11/818,005 dated Mar. 23, 2011; 7 pages.
USPTO Requirement Restriction for U.S. Appl. No. 12/356,468 dated Apr. 22, 2011; 7 pages.
U.S. Appl. No. 12/356,468: "System and Method for Dynamically Generating a Configuration Datasheet," Anderson et al., filed on Jan. 20, 2009; 69 pages.
USPTO Notice of Allowance for U.S. Appl. No. 09/998,848 dated Feb. 17, 2011; 7 pages.
USPTO Non-Final Rejection for U.S. Appl. No. 12/136,557 dated May 5, 2011; 7 pages.
USPTO Non-Final Rejection for U.S. Appl. No. 09/975,338 dated Apr. 30, 2010; 2 pages.
USPTO Non-Final Rejection for U.S. Appl. No. 12/789,399 dated Mar. 10, 2011; 14 pages.
U.S. Appl. No. 12/789,399: "Model for a Hardware Device-Independent Method of Defining Embedded Firmware for Programmable Systems," McDonald et al., filed on May 27, 2010; 32 pages.
USPTO Notice of Allowance for U.S. Appl. No. 11/166,622 dated Apr. 15, 2011; 5 pages.
USPTO Final Rejection for U.S. Appl. No. 11/698,660 dated Apr. 4, 2011; 20 pages.
USPTO Notice of Allowance for U.S. Appl. No. 11/865,672 dated Mar. 2, 2011; 8 pages.
USPTO Notice of Allowance for U.S. Appl. No. 11/857,947 dated Mar. 30, 2011; 8 pages.
USPTO Notice of Allowance for U.S. Appl. No. 12/058,569 dated Apr. 11, 2011; 7 pages.
USPTO Non-Final Rejection for U.S. Appl. No. 12/060,176 dated Apr. 6, 2011; 23 pages.
USPTO Notice of Allowance for U.S. Appl. No. 12/104,672 dated Feb. 14, 2011; 9 pages.
USPTO Advisory Action for U.S. Appl. No. 12/104,678 dated Feb. 16, 2011; 5 pages.
USPTO Final Rejection for U.S. Appl. No. 09/989,767 dated Jan. 18, 2011; 24 pages.
USPTO Notice of Allowance for U.S. Appl. No. 11/201,627 dated Jan. 20, 2011; 8 pages.
USPTO Non-Final Rejection for U.S. Appl. No. 11/200,619 dated Jan. 31, 2011; 14 pages.

* cited by examiner

CIRCUIT AND METHOD FOR IMPROVING THE ACCURACY OF A CRYSTAL-LESS OSCILLATOR HAVING DUAL-FREQUENCY MODES

BACKGROUND OF THE INVENTION

1. Field of the Invention

This invention relates to clock signal generation and, more particularly, to an improved clock generation circuit and method for operating a crystal-less oscillator having at least two distinct frequency modes.

2. Description of the Related Art

The following descriptions and examples are given as background only.

Many integrated circuits (ICs) feature on-chip oscillators. For example, many processor-based systems have internal oscillators, which enable the processor (e.g., a CPU or MCU) to generate its own clock signal without the need for an external oscillator. In some cases, the processor may be configured to operate at two different clock frequencies. In one example, the processor may use a high frequency clock during "awake" modes and a low frequency clock during "sleep" modes. In another, the processor may operate at more than one frequency while awake to trade off speed and power consumption.

In some cases, a single oscillator may be used to generate the high frequency and low frequency clock signals. For example, some systems may include a crystal oscillator for generating the high frequency clock, and a divider for dividing down the high frequency clock to generate the low frequency clock. As known in the art, crystal oscillators use the mechanical resonance of a vibrating crystal of piezoelectric material (typically quartz) to create very precise frequencies. Although crystal oscillators are used in many high-precision applications (e.g., watches, clocks, radio transmitters and receivers, and communication devices such as Local Area Network (LAN) interfaces), they are generally more costly, consume larger amounts of power and require longer start-up times than crystal-less oscillators. Therefore, crystal oscillators may not be desired in all applications.

In other cases, separate oscillators may be used to generate the high frequency and low frequency clock signals. For example, a system may include a high-precision crystal oscillator for generating the high frequency clock and a separate, crystal-less oscillator for generating the low frequency clock. As the name implies, "crystal-less" oscillators do not use crystals for generating clock frequencies. Crystal-less oscillators are generally less accurate than crystal oscillators and other oscillators built with other external components, such as Surface Acoustic Wave (SAW) devices and ceramic resonators. However, crystal-less oscillators are also less expensive and consume less power than their high-precision counterparts. For this reason, crystal-less oscillators are commonly used to provide low frequency clock signals during low power and/or sleep modes, and main clock signals in many power sensitive applications.

Various methods have been proposed to improve the accuracy of crystal-less oscillators. In one method, a crystal oscillator may be used to calibrate or tune a crystal-less oscillator. In some cases, both oscillators may be provided on-chip, as described above. In other cases, an internal crystal-less oscillator may be calibrated by an external crystal (i.e., an off-chip crystal oscillator coupled to the internal oscillator for calibration purposes). However, since the method requires at least one crystal oscillator for calibration purposes, it cannot be used to provide a low cost and/or low power solution to the problem. The external crystal also consumes space on the circuit board and increases the pin count on the IC package (e.g., two extra pins may be needed to connect the external crystal to the package).

A need remains for a highly accurate, multi-frequency, on-chip oscillator. More specifically, a multi-frequency, crystal-less oscillator is needed on-chip to avoid the disadvantages associated with high-precision crystal oscillators (such as, e.g., high cost and power consumption, additional space consumption and extra pins). An improved circuit and method for improving the accuracy of a crystal-less oscillator is also needed. In a preferred embodiment, the improved circuit and method would improve the accuracy of a crystal-less oscillator without using high-precision crystal oscillators or external clock signals for calibration purposes.

SUMMARY OF THE INVENTION

The following description of various embodiments of clock generation circuits, systems and methods is not to be construed in any way as limiting the subject matter of the appended claims.

According to one embodiment, a clock generation circuit is provided for improving the accuracy of a low power oscillator circuit contained therein. In general, the clock generation circuit may include a crystal-less oscillator having at least two distinct frequency modes, including a low frequency mode and a high frequency mode. In some cases, the crystal-less oscillator may be adapted to generate a first clock frequency with relatively high accuracy and a second clock frequency with relatively low accuracy. A calibration and control circuit is included within the clock generation circuit for increasing the accuracy of the second clock frequency. As described in more detail below, the calibration and control circuit may increase accuracy by using the first clock frequency to calibrate the second clock frequency, which is generated by the same crystal-less oscillator. In one implementation, the first clock frequency may be significantly lower than the second clock frequency. Examples of crystal-less oscillators adapted to provide highly accurate, low frequency signals and less accurate, high frequency signals include, but are not limited to, relaxation oscillators and ring oscillators.

In some implementations, the calibration and control circuit may include a frequency multiplier, a pair of counters and control logic. The frequency multiplier may be coupled to the crystal-less oscillator for generating a frequency multiplied version of the first clock signal. For example, the frequency multiplier may be enabled for a short period of time to generate a third clock frequency by multiplying the first clock frequency by an amount, which enables the third clock frequency to be relatively close to the second clock frequency. In some cases, a PLL may be used to provide accurate frequency multiplication. During low frequency modes, the PLL may be disabled to reduce power consumption in the clock generation circuit. The first clock frequency generated by the crystal-less oscillator may be used for clocking downstream components during this time.

The PLL may be enabled for a short period of time during high frequency modes to generate the third clock frequency, as mentioned above. More specifically, the PLL may be run in a closed loop mode until the third clock frequency is generated from the first clock frequency. The PLL may then be run in an open loop mode to maintain the third clock frequency while: (i) the crystal-less oscillator is switched from the first clock frequency to the second clock frequency, and (ii) a frequency difference between the third clock frequency and the second clock frequency is determined. After the frequency difference is determined the PLL may be disabled to reduce power consumption in the clock generation circuit.

The counters and control logic are coupled to the crystal-less oscillator and the PLL for determining the frequency difference between the second and third clock frequencies. For example, a first counter is coupled to the crystal-less oscillator for quantifying the second clock frequency, while a second counter is coupled to the frequency multiplier for quantifying the third clock frequency. The control logic is adapted to determine the frequency difference based on the count values stored within the counters. The control logic uses the frequency difference to modify trim values stored within a trim circuit, which is coupled to the crystal-less oscillator for controlling the frequencies generated therein. The trim values may be adjusted, so that the second clock frequency is substantially equal to the third clock frequency. Once the trim values are adjusted, the calibrated second clock frequency may be used for clocking the downstream components.

According to another embodiment, a method is provided herein for operating a crystal-less oscillator configured to provide at least two distinct frequency modes, including a more accurate, low frequency mode and a less accurate high frequency mode. In some cases, the method may begin by selecting between the low frequency mode and the high frequency mode of the crystal-less oscillator. If the low frequency mode is selected, the method may configure the crystal-less oscillator to generate a first clock signal with low frequency and high accuracy. In some cases, the first clock signal may be forwarded to downstream components for clocking purposes.

If the high frequency mode is selected, the method may configure the crystal-less oscillator to generate a first clock signal with low frequency and high accuracy, before the crystal-less oscillator is reconfigured to generate a second clock signal with significantly higher frequency and lower accuracy. As described in more detail below, the method may use the first clock signal to calibrate the second clock signal, so that an accuracy of the calibrated second clock signal is equal to the accuracy of the first clock signal. In some cases, the calibrated second clock signal may be forwarded to downstream components for clocking purposes.

In some cases, the second clock signal may be calibrated by multiplying the first clock signal by a fixed amount to generate a third clock signal having: (i) a frequency similar to the frequency of the second clock signal, and (ii) an accuracy equivalent to the accuracy of the first clock signal. Next, the method may determine a frequency difference between the second and third clock signals. The frequency of the second clock signal may then be adjusted by an amount equivalent to the frequency difference, so that: (i) a frequency of the calibrated second clock signal is equivalent to the frequency of the third clock signal, and (ii) the accuracy of the calibrated second clock signal is equivalent to the accuracy of the first and third clock signals.

A system is provided in yet another embodiment. The system may include a clock generation circuit comprising a crystal-less oscillator and a calibration and control circuit, as described above. For example, the crystal-less oscillator may be adapted to generate a first clock signal with low frequency and high accuracy and a second clock signal with significantly higher frequency and lower accuracy. The calibration and control circuit may be adapted to use the first clock signal to calibrate the second clock signal, so that the accuracy of the calibrated second clock signal is equal to the accuracy of the first clock signal.

In addition, the system may include one or more components, which are coupled to the clock generation circuit for receiving the first clock signal and/or the calibrated second clock signal. In one implementation, at least one of the system components may be a dual-mode component, which is adapted to use either the first clock signal or the calibrated second clock signal, depending on a current mode of operation. In one example, the dual-mode component may be a microcontroller or microprocessor, which is adapted to minimize power consumption by using the calibrated second clock signal during awake modes and the first clock signal during sleep modes. In other implementations, at least one of the system components may include digital logic, which is adapted to use the calibrated second clock signal periodically or while performing certain functions. In one example, the digital logic component may be a receiver, transmitter or transceiver, which is adapted to use the calibrated second clock signal while receiving or transmitting data.

BRIEF DESCRIPTION OF THE DRAWINGS

Other objects and advantages of the invention will become apparent upon reading the following detailed description and upon reference to the accompanying drawings in which.

Figure 1:
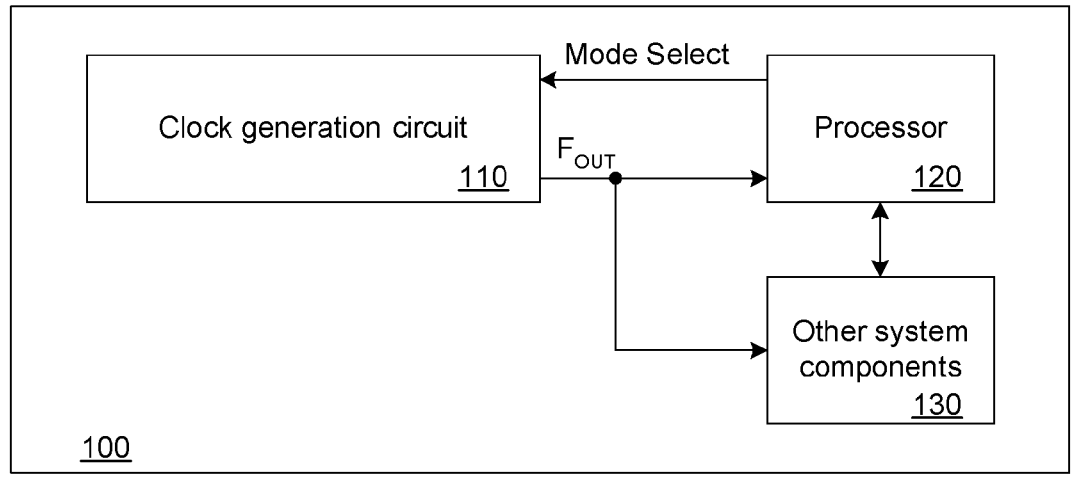
FIG. 1 is a block diagram illustrating one embodiment of a system including a clock generation circuit, a processor and one or more system components.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Oscillator circuits are included within many electronic devices (e.g., computer systems, cellular phones, and palm-top computing devices) to generate a clock signal for synchronizing, pacing and coordinating the operations of various components (e.g., microcontrollers, microprocessors, and communication interfaces) within the electronic device. Two main concerns among users and manufacturers of electronic devices, particularly portable electronic devices, is the ability to reduce the size and cost of the electronic device. Additional concerns include pin usage and start-up time. As described in more detail below, some electronic devices attempt to address these concerns by using crystal-less oscillator circuits at least some of the time. These oscillators are usually less accurate than their high precision counterparts. Therefore, a need exists for an improved circuit and method for improving the accuracy of a crystal-less oscillator circuit.

FIG. 1 illustrates a general embodiment of an electronic device or system 100. In the illustrated embodiment, system 100 includes a clock generation circuit 110, a processor 120 and one or more additional system components 130. As described in more detail below, the clock generation circuit may include a crystal-less oscillator circuit having at least two distinct frequency modes. A mode select signal is supplied to the clock generation circuit for selecting one of the frequency modes. The oscillator circuit generates an appropriate clock signal frequency in response to the mode select signal supplied, e.g., from the processor. Once generated, the clock signal may be supplied to processor 120 and/or one or more system components 130 for controlling operations therein. It is noted, however, that system components 130 may not be included in all embodiments of the invention. If eliminated, the clock signal generated by clock generation circuit 110 may be supplied to processor 120 for controlling operations therein.

In one embodiment, processor 120 may be a microcontroller or microprocessor configured for receiving a high frequency clock signal while operating in one mode (e.g., a high performance mode), and a low frequency clock signal while operating in another mode (e.g., a reduced power mode). In conventional designs, high-precision oscillators (e.g., crystal oscillators) are usually provided on-chip to generate the high frequency clock signals needed when the processor requires a precise clock signal. Crystal oscillators are known for providing highly accurate signals (e.g., within a range of about 10 ppm to about 100 ppm, depending on the specific requirements of the application), but consume larger amounts of power (e.g., a few mA more) than other types of oscillators. For this reason, conventional designs may also include a low power oscillator (e.g., crystal-less oscillator) on-chip to conserve power during other modes of operation (e.g., when accuracy is less of a concern).

In one embodiment, system components 130 may include a communication interface or transceiver for communicating with another electronic device. The communication interface may use a high frequency clock signal only when transmitting or receiving data. In conventional designs, the high frequency clock is typically provided by an on-chip crystal oscillator, due to the high precision required during communication operations. However, the high frequency clock signal may not be needed at all times. In some cases, a crystal-less oscillator may be included on-chip for generating a low frequency clock signal that can be used for controlling other operations within the electronic device.

As noted above, many conventional methods use high-precision crystal oscillators for controlling certain operations, and low power crystal-less oscillators for controlling others. However, such methods are unable to minimize power consumption (and costs) by requiring at least one crystal oscillator be included on-chip. Even though power consumption may be reduced by adding a low power oscillator circuit (e.g., a crystal-less oscillator) to the device, the need for a quartz crystal adds to the overall cost of the electronic device and consumes valuable board space.

In contrast to conventional methods, the present invention uses a single, crystal-less oscillator for generating the internal clock signals needed within system 100. In a preferred embodiment, the crystal-less oscillator is capable of providing at least two distinct frequency modes, including a high frequency mode and a low frequency mode. As such, the clock signals generated by the crystal-less oscillator may be supplied to one or more system components configured for operating at different frequencies (such as, e.g., processor 120 and system components 130).

Figure 2:
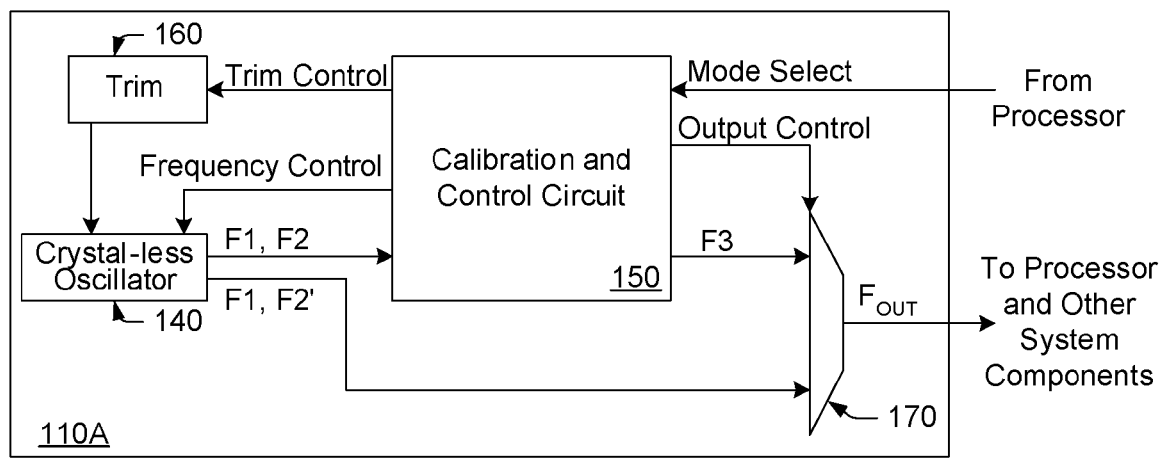
FIG. 2 is a block diagram illustrating one embodiment of the clock generation circuit shown in FIG. 1, including a crystal-less oscillator and a calibration and control circuit.

FIG. 2 illustrates a general embodiment of clock generation circuit 110 shown in FIG. 1. In the illustrated embodiment, the clock generation circuit includes a crystal-less oscillator 140, a calibration and control circuit 150, a trim circuit 160, and a selection circuit 170. Other circuits not specifically shown herein may also be included within clock generation circuit 110.

Crystal-less oscillator 140 provides at least two distinct frequency modes, including a high frequency mode and a low frequency mode. In one embodiment, crystal-less oscillator 140 may generate a highly accurate, low frequency clock signal F1, and a significantly less accurate, high frequency clock signal F2. The opposite may be true in alternative embodiments of the invention. However, only the previous embodiment will be described in more detail below for purposes of brevity. One skilled in the art would understand how the invention could be modified to accommodate a crystal-less oscillator, which generates a high speed clock with significantly greater accuracy than a low speed clock.

Calibration and control circuit 150 provides various control signals to the clock generation circuit components. For example, circuit 150 may provide a frequency control signal to the crystal-less oscillator for selecting a high frequency mode or a low frequency mode based on the mode select signal supplied from processor 120. In addition, circuit 150 may provide a trim control signal to trim circuit 160 for "trimming" or adjusting the frequencies generated within crystal-less oscillator 140.

In some cases, calibration and control circuit 150 may provide an output control signal to selection circuit 170 for selectively forwarding an appropriate output signal to downstream system components (such as processor 120 and system components 130). As shown in FIG. 2, selection circuit 170 may be coupled to crystal-less oscillator 140 and circuit 150 for receiving the clock signal frequencies generated thereby. In a preferred embodiment, only the clock signal frequencies F1/F2' generated by crystal-less oscillator 140 may be forwarded to the downstream system components. This embodiment may be particularly useful in power sensitive applications. However, the clock signal frequency F3 generated by circuit 150 may be useful when power consumption is less of a concern. For this reason, selection circuit 170 retains the ability to forward the F3 clock frequency to downstream system components.

In the embodiment disclosed herein, calibration and control circuit 150 is included for increasing the accuracy of the high frequency clock signal F2 generated by the crystal-less oscillator. As described in more detail below, the calibration and control circuit may increase accuracy by using the highly accurate, low frequency clock F1 to calibrate the less accurate, high frequency clock F2. The calibration method described herein enables the crystal-less oscillator 140 to generate a more accurate trimmed version F2' of the high frequency clock originally produced by the oscillator. Unlike conventional methods, which use one oscillator for calibrating another oscillator, the low frequency and high frequency clock signals described herein are generated by the same crystal-less oscillator 140. This provides many advantages including, but not limited to, reduced costs, power and area consumption.

Crystal-less oscillator 140 may be any oscillator circuit, which does not use a crystal for generating a frequency. Examples of crystal-less oscillators include, but are not limited to, relaxation oscillators, ring oscillators, MEMS (microelectromechanical system) oscillators, Pierce oscillators and Collpits oscillators. Most crystal-less oscillators are significantly less accurate than high-precision crystal oscillators, even when operating at low speeds. For example, the frequencies generated by a low-speed crystal-less oscillator may vary by about ±2% to about ±20%. In some cases, the oscillator frequency may be trimmed during the IC manufacturing test stage to reduce the effect of process variations. In some cases, trimming may reduce the inaccuracy of the low-speed crystal-less oscillator into the ±0.5-1.0% range.

However, low-speed crystal-less oscillators are significantly less accurate when operated at higher frequencies. In one example, the inaccuracy of a low-speed crystal-less oscillator may range from about <1% at 3 MHz to about ±10% at 96 MHz. One reason for the variation is that small offsets, sub-circuit delays and/or leakage currents have a larger effect on oscillation frequency at higher frequencies. Variation in these factors is often a major limiting factor in the accuracy of these oscillators at higher frequencies.

In some cases, an accurate, high speed clock may be generated by operating a low-speed crystal-less oscillator at a relatively accurate low frequency (e.g., 3 MHz) and then multiplying the low frequency signal up to a higher frequency (e.g., 96 MHz). In some cases, a phase-locked loop (PLL) may be used to provide accurate frequency multiplication. For example, a PLL may be used to generate a relatively accurate 96 MHz clock signal (e.g., with about 1% inaccuracy) by multiplying the low frequency signal generated by the 3 MHz crystal-less oscillator (having, e.g., about 1% inaccuracy at 3 MHz). The high speed clock generated by the PLL could then be used for clocking downstream circuit components.

However, in order to generate the high speed clock, the PLL described above must be run on a continual basis (or for at least as long as the high speed clock is desired). PLLs generally consume large amounts of current and increase the phase noise of the frequency that they multiply. Operating a PLL in such a manner, therefore, ensures that the current consumption and phase noise of a low speed oscillator +PLL will be substantially greater than that of a low speed oscillator running at higher speeds. This prohibits such a method from being used in many power and noise sensitive applications.

Figure 3:
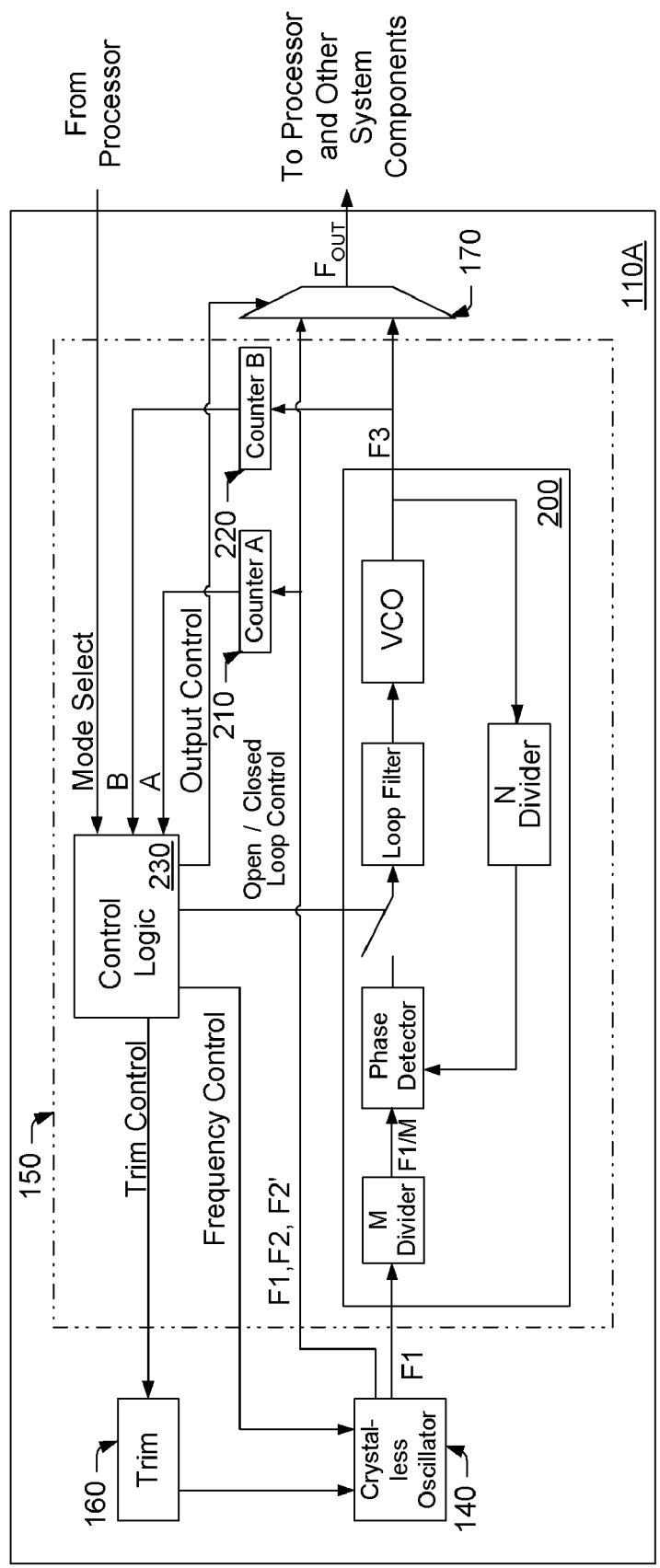
FIG. 3 is a block diagram illustrating various components of the clock generation circuit in more detail in accordance with a first embodiment of the invention.
Figure 4:
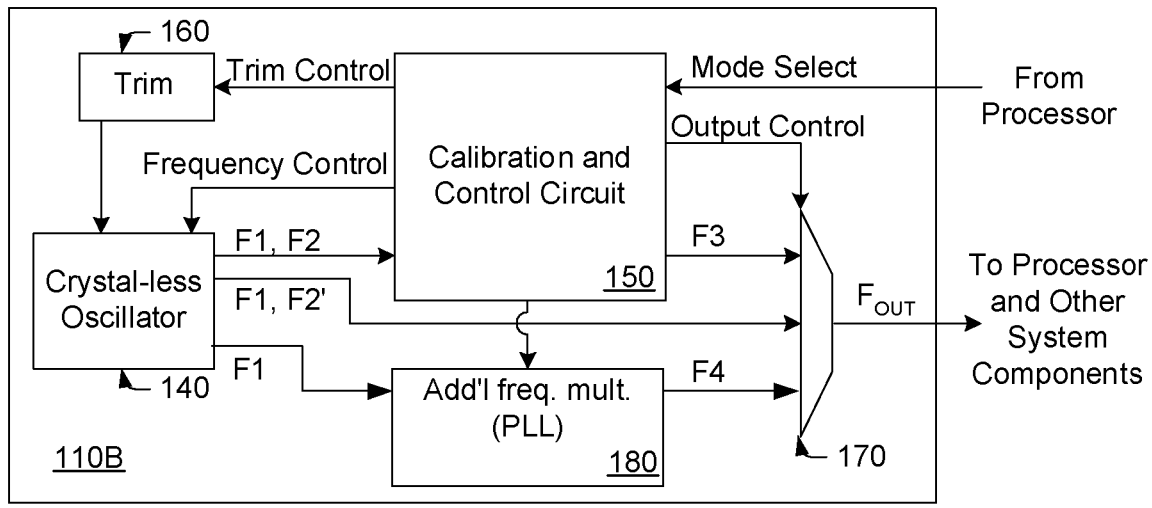
FIG. 4 is a block diagram illustrating various components of the clock generation circuit in more detail in accordance with a second embodiment of the invention.
Figure 5:
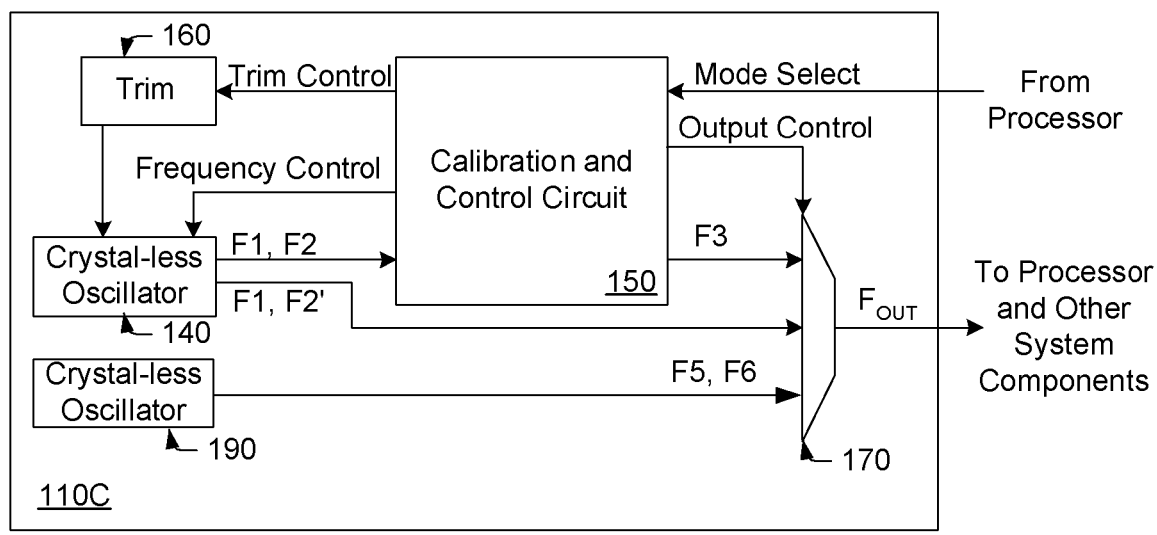
FIG. 5 is a block diagram illustrating various components of the clock generation circuit in more detail in accordance with a third embodiment of the invention.

The present invention overcomes all of the above-mentioned problems by providing a high accuracy, low power, and low noise clock generation circuit 110. Various embodiments of the improved clock generation circuit 110 are shown in FIGS. 3-5. Each of the embodiments shown herein includes a crystal-less oscillator 140, a calibration and control circuit 150, a trim circuit 160, and a selection circuit 170, as described above in reference to FIG. 2. One possible implementation of the calibration and control circuit is described below in reference to FIG. 3. In some cases, additional components may be included within the clock generation circuit to provide additional functionality, as described below in reference to FIGS. 4 and 5.

Referring to FIG. 3, the crystal-less oscillator 140 may be configured, in at least one embodiment, to generate a relatively accurate, low frequency clock signal F1, and a significantly less accurate, high frequency clock signal F2. In one example, the low-speed crystal-less oscillator may be implemented with the Internal Main Oscillator (IMO) which is a subsystem of the PsoC devices manufactured by Cypress Semiconductor Corp. of San Jose, Calif. Such an oscillator may be configured to operate at a number of frequencies ranging from about 3 MHz to about 96 MHz, with an inaccuracy ranging from about <1% (at 3 MHz) to about ±10% (at 96 MHz). However, oscillator 140 is not limited to the IMO from Cypress Semiconductor Corp. and may be implemented with other crystal-less oscillator circuits in other embodiments of the invention.

In one embodiment, calibration and control circuit 150 may be configured for increasing the accuracy of the high frequency clock signal F2 generated by crystal-less oscillator 140. In one example, the calibration and control circuit may include a frequency multiplier 200, a pair of counters 210/220, and control logic 230. The frequency multiplier may be a phase-locked loop (PLL), for example. However, other frequency multipliers not specifically mentioned herein may be used to provide accurate frequency multiplication in other embodiments of the invention. For example, a frequency locked loop (FLL) or delay locked loop (DLL) may be used in place of the PLL specifically mentioned herein.

As described in more detail below, the PLL may be enabled or disabled, depending on a chosen mode of operation. For example, the PLL may be disabled to reduce power consumption in the clock generation circuit when the crystal-less oscillator is configured for operating in a low frequency mode. During this mode, the accurate low frequency signal F1 generated by the crystal-less oscillator may be supplied to downstream system components by applying the appropriate output control signal to selection circuit 170. During high frequency modes, however, the PLL may be enabled for a short period of time to calibrate the less accurate high frequency signal F2 generated by the crystal-less oscillator. For example, the PLL may generate an accurate high frequency signal F3 by multiplying the frequency of the low frequency signal F1 generated by the crystal-less oscillator. The accurate frequency generated by the PLL may then be used to calibrate the less accurate, high frequency signal F2 generated by the crystal-less oscillator. After calibration is complete, the PLL may be disabled to reduce power consumption in the clock generation circuit.

In preferred embodiments, the high frequency signal F3 generated by the PLL is used for calibration purposes only, and is not supplied to downstream components as a clocking signal. Instead, the downstream components are clocked by the calibrated high frequency signal FT generated by crystal-less oscillator 140. Power consumption is significantly reduced by enabling the PLL for only a short period of time during the calibration phase. Phase noise is reduced from the clocking signal by removing the PLL from the clock signal path.

In the embodiment of FIG. 3, counters A and B 210/220 and control logic 230 are coupled between the crystal-less oscillator and the PLL for adjusting the frequency of the oscillator. In particular, counter A is coupled to the crystal-less oscillator for quantifying the less accurate, high frequency signal F2, while counter B is coupled to the PLL for quantifying the more accurate, high frequency signal F3. In some cases, counters A and B may include the same number of bits (e.g., 10-bits). In other cases, counters A and B may include substantially different numbers of bits (e.g., 8-bits and 9-bits). As described in more detail below, control logic 230 may be coupled between counters A and B and trim circuit 160 for modifying the trim values stored within the trim circuit, based on the count values stored within counters A and B.

In general, the control logic 230 may be configured to determine a frequency difference between F2 and F3, and modify the trim values stored within trim circuit 160 based on such difference. For example, the control logic may determine the magnitude and direction of the frequency difference by comparing the count values stored within counters A and B. In one implementation, the control logic may comprise firmware running on a processor. The firmware may use an algorithm and/or a look-up table to determine the frequency difference between F2 and F3, based on the count values stored within counters A and B. The processor/control logic could then be used to change the trim values controlling the oscillator frequency. In another implementation, the control logic may use digital logic gates to perform the functions mentioned above.

In one embodiment, the frequency difference may be determined from the count value stored within one counter (e.g., counter A) when the count value stored within the other counter (e.g., counter B) overflows (or vice versa). For example, the frequency difference may be determined by subtracting count value A from count value B when counter B overflows. In this embodiment, the calibration process would end after the appropriate trim control signal is supplied to the trim circuit 160 for adjusting the oscillator frequency by the appropriate amount.

In another embodiment, an iterative process may be used to determine the frequency difference. For example, the count values stored within counters A and B may be repeatedly compared, and the trim factor repeatedly adjusted, until the count value stored within counter A (i.e., the oscillator frequency counter) is substantially equal to the count value stored within counter B (i.e., the PLL frequency counter). In this embodiment, the calibration process would end once the calibrated oscillator frequency FT substantially equals the PLL frequency F3.

Figure 6:
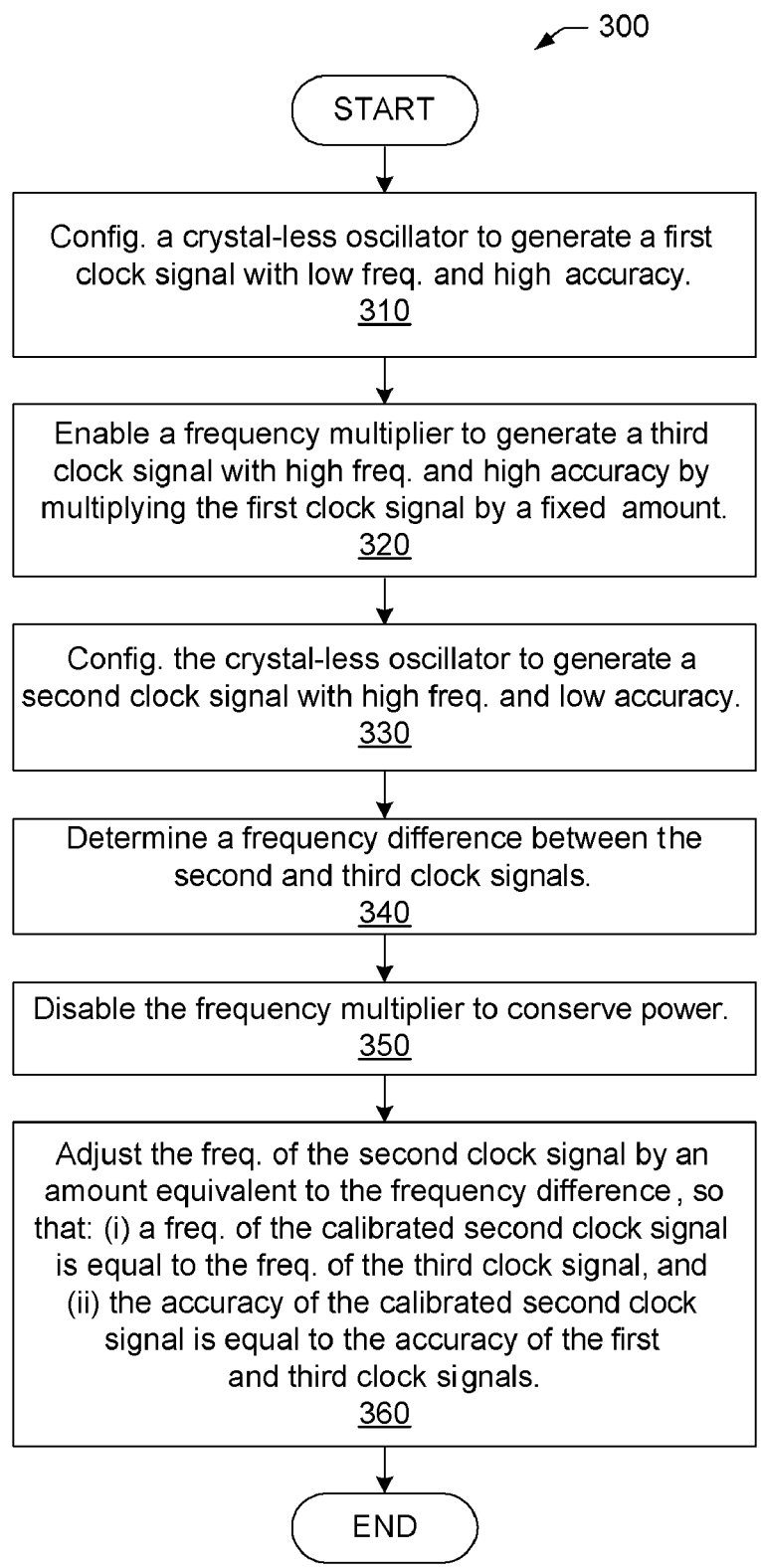
FIG. 6 is a flow-chart diagram illustrating one embodiment of a method that may be used for calibrating a crystal-less oscillator.

An improved method for calibrating a crystal-less oscillator will now be described in reference to FIGS. 3 and 6. In particular, FIG. 6 illustrates one embodiment of a method for using the accurate, low frequency signal F1 generated by crystal-less oscillator 140 to calibrate the less accurate, high frequency signal F2 generated by the same oscillator. However, one skilled in the art would understand how the method could be modified to use an accurate high speed clock for calibrating an inaccurate low speed clock from the same oscillator.

In one embodiment, the method 300 may begin 310 by configuring the crystal-less oscillator to generate a first clock signal F1, having a relatively low frequency and high accuracy. In one example, the IMO provided by Cypress Semiconductor Corp. may be used to generate a 3 MHz clock signal with less than about 1% inaccuracy. Next, a frequency multiplier may be enabled 320 to generate a third clock signal F3 with relatively high frequency and accuracy by multiplying the first clock signal by a fixed amount.

In one embodiment, a PLL may be used to provide accurate frequency multiplication. For example, the PLL may include a phase comparator, a loop filter, a voltage controlled oscillator and one or more frequency dividers, as shown in FIG. 3. The phase comparator may compare the phase of the feedback signal F3 to the first clock signal F1 generated by crystal-less oscillator 140 and generate an error signal, or phase correction signal, in response thereto. The error signal is filtered by the loop filter and supplied to the VCO for adjusting the oscillation frequency therein. In some embodiments, a pair of frequency dividers may be used to provide a desired amount of frequency multiplication. As shown in FIG. 3, for example, an M divider may be used to divide the first clock signal F1 by M (where M is greater than 1), while an N divider is used to divide the third clock signal F3 by N (where N is greater than 1). By multiplying the frequency of the first clock signal F1 by N/M, the embodiment shown in FIG. 3 provides more flexibility and resolution in the PLL output signal.

The PLL must be configured in closed-loop mode to generate a highly accurate, frequency-multiplied version of the first clock signal. In some cases, control logic 230 may send a closed loop control signal to the PLL after the first signal is generated 310 to configure the PLL in closed-loop mode. After locking to the crystal-less oscillator frequency F1, the PLL may generate an accurate, high frequency clock signal F3 by multiplying the low frequency signal F1 by a fixed amount (e.g., N/M).

After the third clock signal is generated 320, the crystal-less oscillator may be reconfigured 330 to generate a second clock signal F2 having relatively high frequency and low accuracy. In one example, the IMO provided by Cypress Semiconductor Corp. may be used to generate a 96 MHz clock signal with about ±10% inaccuracy. To avoid locking to the new frequency, the PLL is reconfigured to run in open-loop mode before the crystal-less oscillator is reconfigured 330 to generate the second clock frequency Running the PLL in open-loop mode enables the PLL to maintain the third clock signal F3 for later comparison with the second clock signal.

Typically, a PLL can be configured to keep oscillating after the input clock source is removed. This is known as operating the PLL open-loop. In the embodiment of FIG. 3, control logic 230 may send an open loop control signal to the PLL after the third clock signal is generated 320 to configure the PLL in open-loop mode. The PLL output frequency will slowly drift in open loop mode, for example, due to leakage on the capacitor used to control the VCO input voltage. However, drift rates of less than about 1 ppm/ms are readily achievable. As such, the PLL drift rate may have negligible impact on the calibration accuracy.

After the second clock signal is generated 330, the frequency difference between the second and third clock signals may be determined 340. In one embodiment, a pair of counters 210/220 may be used to count the number of oscillator cycles that occur during a fixed number of cycles of the open-loop PLL output (or vice versa). The frequency of the second clock signal may be reduced 360 if the number of oscillator cycles is greater than the number of PLL cycles. On the other hand, the frequency of the second clock signal may be increased 360 if the number of oscillator cycles is less than the number of PLL cycles. Regardless, the frequency of the second clock signal may be adjusted by an amount equal to the frequency difference, so that the frequency of the calibrated second clock signal FT is equal to the frequency of the third clock signal F3. In one embodiment, control logic 230 may adjust the frequency of the second clock signal by changing the trim values stored within trim circuit 160.

In some embodiments, the PLL may be disabled 350 before the frequency of the second clock signal is adjusted. This would minimize power consumption by enabling the PLL for only a short period of time during the calibration phase. However, the PLL may not be disabled before step 360 in all embodiments of the invention. In an alternative embodiment, the PLL may be disabled after the frequency of the second clock signal is adjusted. However, such an embodiment would increase power consumption, and thus, may not be desired in some applications.

In some embodiments, the calibration time may be approximately 10 μs when counters A and B are implemented with 10-bit timers. 10-bit timers may also enable the high speed clock F2 to be calibrated within approximately 0.1% of the low speed clock F1 generated by the same crystal-less oscillator 140. In some cases, longer timers (i.e., with more bits) may be used to provide more accurate calibration at the cost of longer calibration time, and thus, slightly greater overall power consumption (because the PLL will be operational for a greater percent of the time). Conversely, calibration time may be reduced by using shorter timers (i.e., with less bits), at the cost of slightly higher inaccuracy.

Figure 7:
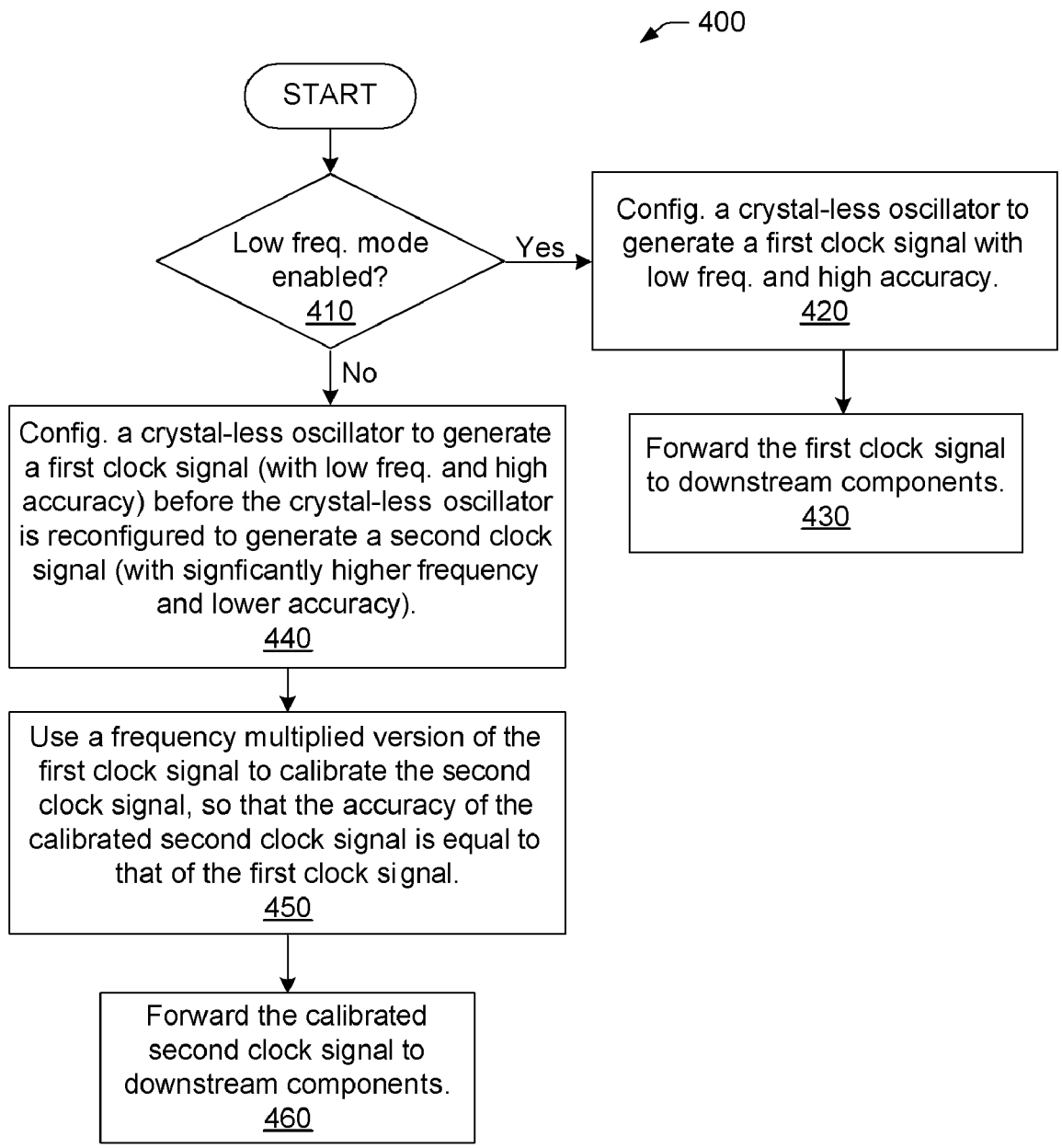
FIG. 7 is a flow-chart diagram illustrating one embodiment of a method that may be used for operating a crystal-less oscillator.

Various methods for operating a multi-frequency crystal-less oscillator are also contemplated herein. A general method 400 is shown in FIG. 7 for operating a crystal-less oscillator configured to provide at least two distinct frequency modes, including a low frequency mode and a high frequency mode. In some cases, the method may begin by selecting between the low frequency and high frequency modes. If the low frequency mode is enabled 410, the crystal-less oscillator may be configured 420 to generate a first clock signal with relatively low frequency and high accuracy. The first clock signal may then be forwarded 430 to downstream components for clocking purposes.

If the high frequency mode is enabled 410, the first clock signal may be used to calibrate a (significantly less accurate) second clock signal generated by the same crystal-less oscillator. The calibration method may be similar to the method described above in reference to FIG. 6. For example, the crystal-less oscillator may be configured to generate a first clock signal with relatively low frequency and high accuracy. A frequency multiplier may be enabled to generate an accurate, frequency multiplied version of the first clock signal (i.e., a third clock signal) by multiplying the frequency of the first clock signal by a fixed amount. The crystal-less oscillator may then be reconfigured 440 to generate the second clock signal with significantly higher frequency and lower accuracy.

Once the second clock signal is generated, the frequency multiplied version of the first clock signal (i.e., the third clock signal) may be used to calibrate 450 the second clock signal. For example, digital logic may be used to determine a frequency difference between the second and third clock signals. The digital logic may also be used to adjust the frequency of the second clock signal by an amount equivalent to the frequency difference, so that: (i) the frequency of the calibrated second clock signal is substantially equal to the frequency of the third clock signal, and (ii) the accuracy of the calibrated second clock signal is substantially equal to the accuracy of the first and third clock signals. After calibration, the calibrated second clock signal may be forwarded 460 to downstream components for clocking purposes.

Several implementations of the method are possible. All implementations make use of a crystal-less oscillator configured to provide a low frequency mode and a high frequency mode, as described above.

In one implementation, an electronic device or system may operate on a duty cycle basis by alternately sleeping and waking to reduce overall power consumption. Although such systems may require an accurate high frequency clock when awake, a less accurate clock may suffice during sleep states. In some cases, the low frequency mode may be enabled during sleep states to minimize overall power consumption. In other cases, the high frequency mode may be enabled to provide the accurate high frequency clock needed when the system is awake. Although power consumption may slightly increase during high frequency modes (due, e.g., to higher current consumption when the crystal-less oscillator is in high frequency mode), the overall power consumption of the clock generation circuit would be reduced by alternating between high frequency and low frequency modes.

In another implementation, an electronic device or system may use a low frequency clock for most operations, while a high frequency clock is used only periodically or during certain operations. In one example, a communication interface or transceiver may use a high speed clock when transmitting and/or receiving data and a low speed clock at all other times. A system processor may also run at the lower clock frequency. The processor may be clocked directly from the crystal-less oscillator when the oscillator is configured in low frequency mode. However, the oscillator output may be divided down to generate the low speed clock used by the processor when the oscillator is configured in high frequency mode (e.g., when the communication interface is transmitting/receiving data).

In yet another implementation, an electronic device or system may use a high frequency clock for most operations, while a low frequency clock is used for calibration purposes. In some cases, the clocked components may be halted for the duration of the calibration process. For example, the selection circuit 170 shown in FIG. 3 may be disabled, so that clocking signals are not forwarded to the downstream components during the calibration process. In other cases, one or more additional components may be included within the clock generation circuit, so that the clocked components may continue to operate while the high frequency clock is being calibrated. Various examples are provided in FIGS. 4 and 5.

FIG. 4 illustrates a clock generation circuit 110B in accordance with one alternative embodiment of invention. As shown in FIG. 4, an additional PLL 180 may be included for clocking one or more system components, while the high frequency clock from crystal-less oscillator 140 is being calibrated. The alternative embodiment shown in FIG. 4 may generally operate as follows.

After the crystal-less oscillator is configured to generate the low frequency clock (e.g., step 310 of FIG. 6), the calibration and control circuit 150 supplies a closed loop control signal to the PLLs 200/180. This closes the loops and enables the PLLs to generate the higher clock frequencies F3 and F4, respectively, by multiplying the frequency of the low speed clock F1. The PLLs 200/180 are then reconfigured to run in open loop mode. The loop frequency F3 generated by PLL 200 may be used to calibrate the higher clock frequency F2 generated by oscillator 140, as described above. In some cases, the loop frequency F4 generated by PLL 180 may be used to clock the system components while calibration is taking place. For example, calibration and control circuit 150 may enable selection circuit 170 to forward the F4 frequency to the downstream components.

FIG. 5 illustrates a clock generation circuit 110C in accordance with another alternative embodiment of the invention. As shown in FIG. 5, an additional crystal-less oscillator 190 may be included for clocking one or more system components, while the high frequency clock from crystal-less oscillator 140 is being calibrated. The alternative embodiment shown in FIG. 5 may generally operate as follows.

In some cases, the additional crystal-less oscillator 190 may be substantially identical to oscillator 140. As such, the additional oscillator 190 may generate a highly accurate low frequency signal F5, and significantly less accurate high frequency signal F6. In some cases, the system components may use the high speed clock F6 generated by oscillator 190, while the high speed clock F2 generated by oscillator 140 is being calibrated. In other cases, the system components may use the low speed clock F5 generated by oscillator 190, while high speed clock F2 generated by oscillator 140 is being calibrated. In yet other cases, the clock generation circuit 110C shown in FIG. 5 may be used to provide accurate low frequency and high frequency outputs to the system components at the same time.

In some cases, the clock generation circuit 110A shown in FIG. 3 may be preferred over the alternative embodiments shown in FIGS. 4-5. For example, the clock generation circuit 110A shown in FIG. 3 may be used to minimize costs, as well as power and area consumption. However, some applications may require a clocking signal at all times. In such applications, the additional components shown in FIGS. 4 and 5 may be used to generate an acceptable clocking signal while crystal-less oscillator 140 is being calibrated.

It will be appreciated to those skilled in the art having the benefit of this disclosure that this invention is believed to provide an improved clock generation circuit and method for operating a crystal-less oscillator having at least two distinct frequency modes. Further modifications and alternative embodiments of various aspects of the invention will be apparent to those skilled in the art in view of this description. For example, although the aforementioned discussion has focused on the two-frequency case, it can be generalized to an oscillator that generates many possible frequencies, each of which could be calibrated by the above-mentioned method. It is intended, therefore, that the following claims be interpreted to embrace all such modifications and changes and, accordingly, the specification and drawings are to be regarded in an illustrative rather than a restrictive sense.

What is claimed is:

1. A clock generation circuit, comprising:
   a crystal-less oscillator adapted to generate a first clock frequency with relatively high accuracy, and a second clock frequency with relatively low accuracy; and
   a calibration circuit adapted to increase the accuracy of the second clock frequency by using a frequency multiplied version of the first clock frequency to calibrate the second clock frequency, wherein the calibration circuit comprises a frequency multiplier configured to be enabled only during calibration of the second clock frequency, wherein the frequency multiplier comprises a phase-locked loop (PLL) which is configured during the calibration time period to:
   run in a closed loop mode until a third clock frequency is generated from the first clock frequency; and
   thereafter run in an open loop mode to maintain the third clock frequency.

2. The clock generation circuit as recited in claim 1, wherein the crystal-less oscillator is selected from a group comprising relaxation oscillators, ring oscillators, microelectromechanical system oscillators, Pierce oscillators and Collpits oscillators.

3. The clock generation circuit as recited in claim 1, wherein the first clock frequency is significantly lower than the second clock frequency.

4. The clock generation circuit as recited in claim 1, wherein the frequency multiplier is coupled to the crystal-less oscillator, and wherein:
   during a first mode, the frequency multiplier is disabled and the first clock frequency is supplied to downstream components coupled to the clock generation circuit;
   and during a second mode, the frequency multiplier is enabled for a short period of time to generate a third clock frequency by multiplying the first clock frequency by an amount, which enables the third clock frequency to be relatively close to the second clock frequency.

5. The clock generation circuit as recited in claim 4, wherein the accuracy of the third clock frequency generated by the frequency multiplier is substantially equal to the accuracy of the first clock signal generated by the crystal-less oscillator.

6. The clock generation circuit as recited in claim 5, wherein the phase-locked loop (PLL) configured
   to run in the open loop mode while: (i) the crystal-less oscillator is switched from the first clock frequency to the second clock frequency, and (ii) a frequency difference between the third clock frequency and the second clock frequency is determined.

7. The clock generation circuit as recited in claim 6, wherein after the frequency difference is determined, the PLL is disabled and the calibrated second clock frequency is supplied to downstream components coupled to the clock generation circuit.

8. The clock generation circuit as recited in claim 5, wherein the calibration circuit further comprises:
   a control circuit coupled to the crystal-less oscillator and the frequency multiplier for determining a frequency difference between the second clock frequency and the third clock frequency; and
   a trim circuit coupled between the control circuit and the crystal-less oscillator for adjusting the second clock frequency based on the frequency difference determined by the control circuit, so that the second clock frequency is substantially equal to the third clock frequency.

9. The clock generation circuit as recited in claim 8, wherein the control circuit comprises:
   a first counter coupled to the crystal-less oscillator for quantifying the second clock frequency;
   a second counter coupled to the frequency multiplier for quantifying the third clock frequency; and
   control logic coupled between the first and second counters and the trim circuit for: (i) determining the frequency difference between the second and third clock frequencies, and (ii) using the frequency difference to modify values stored within the trim circuit, so that the second clock frequency is set substantially equal to the third clock frequency.

10. A method for operating a crystal-less oscillator configured for providing at least two distinct frequency modes, the method comprising:
    selecting between a low frequency mode and a high frequency mode of the crystal-less oscillator, wherein if the high frequency mode is selected, the method further comprises:
    configuring the crystal-less oscillator to generate a first clock signal with low frequency and high accuracy before the crystal-less oscillator is reconfigured to generate a second clock signal with significantly higher frequency and lower accuracy;
    using the first clock signal to calibrate the second clock signal, by enabling a frequency multiplier only during calibration of the second clock frequency and using a frequency multiplied version of the first clock signal, so that an accuracy of the calibrated second clock signal is substantially equal to the accuracy of the first clock signal, wherein using the first clock signal to calibrate the second clock signal comprises multiplying the first clock signal by a fixed amount to generate a third clock signal, wherein the frequency multiplier is configured to:
    run in a closed loop mode until the third clock signal is generated from the first clock signal; and thereafter
    run in an open loop mode to maintain the third clock signal; and
    forwarding the calibrated second clock signal to downstream components.

11. The method as recited in claim 10, wherein if the low frequency mode is selected, the method further comprises:

configuring the crystal-less oscillator to generate the first clock signal with low frequency and high accuracy; and forwarding the first clock signal to downstream components.

12. The method as recited in claim 10, wherein the third clock signal has: (i) a frequency similar to the frequency of the second clock signal, and (ii) an accuracy equivalent to the accuracy of the first clock signal, and wherein using the first clock signal to calibrate the second clock signal comprises:

determining a frequency difference between the second clock signal and the third clock signal; and adjusting the frequency of the second clock signal by an amount equivalent to the frequency difference, so that: (i) a frequency of the calibrated second clock signal is substantially equivalent to the frequency of the third clock signal, and (ii) the accuracy of the calibrated second clock signal is substantially equivalent to the accuracy of the first and third clock signals.

13. The method as recited in claim 12, wherein the frequency multiplier is configured to run in the open loop mode while: (i) the crystal-less oscillator is reconfigured to generate the second clock signal, and (ii) the frequency difference between the second clock signal and the third clock signal is determined.

14. The method as recited in claim 13, wherein after the determining, the method further comprises disabling the frequency multiplier to conserve power.

15. A system, comprising:

a clock generation circuit including a crystal-less oscillator and a calibration circuit, wherein the crystal-less oscillator is adapted to generate a first clock signal with low frequency and high accuracy and a second clock signal with higher frequency and lower accuracy, and wherein the calibration circuit is adapted to use the first clock signal to calibrate the second clock signal, by using a frequency multiplied version of the first clock frequency, so that an accuracy of the calibrated second clock signal is substantially equal to the accuracy of the first clock signal, wherein the calibration circuit comprises a frequency multiplier configured to be enabled only during calibration of the second clock signal, wherein the frequency multiplier is configured to multiply the first clock signal by a fixed amount to generate a third clock signal, wherein the frequency multiplier is further configured to:

run in a closed loop mode until the third clock signal is generated from the first clock signal; and thereafter run in an open loop mode to maintain the third clock signal; and one or more system components coupled to the clock generation circuit for receiving at least one of the first clock signal and the calibrated second clock signal.

16. The system as recited in claim 15, wherein the frequency multiplier is coupled to the crystal-less oscillator, wherein the third clock signal has (i) a frequency similar to the frequency of the second clock signal, and (ii) an accuracy equivalent to the accuracy of the first clock signal, and wherein the calibration circuit comprises:

the frequency multiplier;

a control circuit coupled to the crystal-less oscillator and the frequency multiplier for determining a frequency difference between the second clock signal and the third clock signal; and a trim circuit coupled between the control circuit and the crystal-less oscillator for adjusting the frequency of the second clock signal by an amount equal to the frequency difference, so that: (i) a frequency of the calibrated second clock signal is substantially equal to the frequency of the third clock signal, and (ii) the accuracy of the calibrated second clock signal is substantially equal to the accuracy of the first and third clock signals.

17. The system as recited in claim 15, wherein at least one of the system components is dual-mode component adapted to use either the first clock signal or the calibrated second clock signal, depending on a current mode of operation.

18. The system as recited in claim 17, wherein the at least one system component comprises a processor, which is adapted to minimize power consumption by using the calibrated second clock signal during awake modes and the first clock signal during sleep modes.

19. The system as recited in claim 15, wherein at least one of the system components is adapted to use the calibrated second clock signal only periodically or while performing certain functions.

20. The system as recited in claim 19, wherein the at least one system component comprises a receiver, transmitter or transceiver, which is adapted to use the calibrated second clock signal while receiving or transmitting data.

* * * * *